(12) United States Patent
Yoshioka

(10) Patent No.: US 8,004,449 B2
(45) Date of Patent: Aug. 23, 2011

(54) CHARGE REDISTRIBUTION DIGITAL-TO-ANALOG CONVERTER, AND SUCCESSIVE APPROXIMATION REGISTER ANALOG-TO-DIGITAL CONVERTER HAVING THE SAME

(75) Inventor: Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/757,221

(22) Filed: Apr. 9, 2010

(65) Prior Publication Data
US 2010/0265113 A1 Oct. 21, 2010

(30) Foreign Application Priority Data

Apr. 20, 2009 (JP) ................. 2009-101968

(51) Int. Cl.
*H03M 1/12* (2006.01)
(52) U.S. Cl. .............. 341/172; 341/150; 341/163
(58) Field of Classification Search .......... 341/150, 341/163, 172
See application file for complete search history.

(56) References Cited

U.S. PATENT DOCUMENTS

| | | | | |
|---|---|---|---|---|
| 4,975,700 A | * | 12/1990 | Tan et al. ............. | 341/118 |
| 5,581,252 A | * | 12/1996 | Thomas ................ | 341/144 |
| 6,433,727 B1 | * | 8/2002 | Yoshinaga ............ | 341/172 |
| 6,621,444 B1 | * | 9/2003 | Confalonieri et al. .. | 341/150 |
| 6,664,911 B2 | | 12/2003 | Hirai | |
| 7,167,121 B2 | | 1/2007 | Carreau et al. | |
| 7,233,273 B2 | | 6/2007 | Tachibana et al. | |
| 7,432,844 B2 | * | 10/2008 | Mueck et al. ......... | 341/163 |
| 7,501,974 B2 | * | 3/2009 | Confalonieri et al. .. | 341/172 |

FOREIGN PATENT DOCUMENTS

| | | |
|---|---|---|
| JP | 06-164399 A | 6/1994 |
| JP | 2003-152541 A | 5/2003 |
| JP | 2006-503495 A | 1/2006 |
| JP | 2007-142863 | 6/2007 |

* cited by examiner

*Primary Examiner* — Khai M Nguyen
(74) *Attorney, Agent, or Firm* — Arent Fox LLP

(57) ABSTRACT

A D/A converter includes plus-side and minus-side input terminals; plus-side and minus-side D/A converters each including plural plus-side or minus-side capacitors having capacitance values weighted by the powers of two, a plus-side or minus-side output terminals connected to first electrodes of the plus-side or minus-side capacitors, and plural plus-side or minus-side switches for connecting each second electrode of the plus-side or minus-side capacitors to either the plus-side or minus-side input terminal, a plus-side reference voltage terminal or a minus-side reference voltage terminal according to plus-side or minus-side control digital signals; and plural short-circuit switches provided between identically weighted plus-side and minus-side capacitors respectively. And, at the time of sampling, the plus-side and minus-side switches connect the second electrodes of the capacitors to the plus-side and minus-side input terminals, respectively, and, after the sampling, the plurality of short-circuit switches short-circuit between the second electrodes of the plus-side and minus-side capacitors.

11 Claims, 24 Drawing Sheets

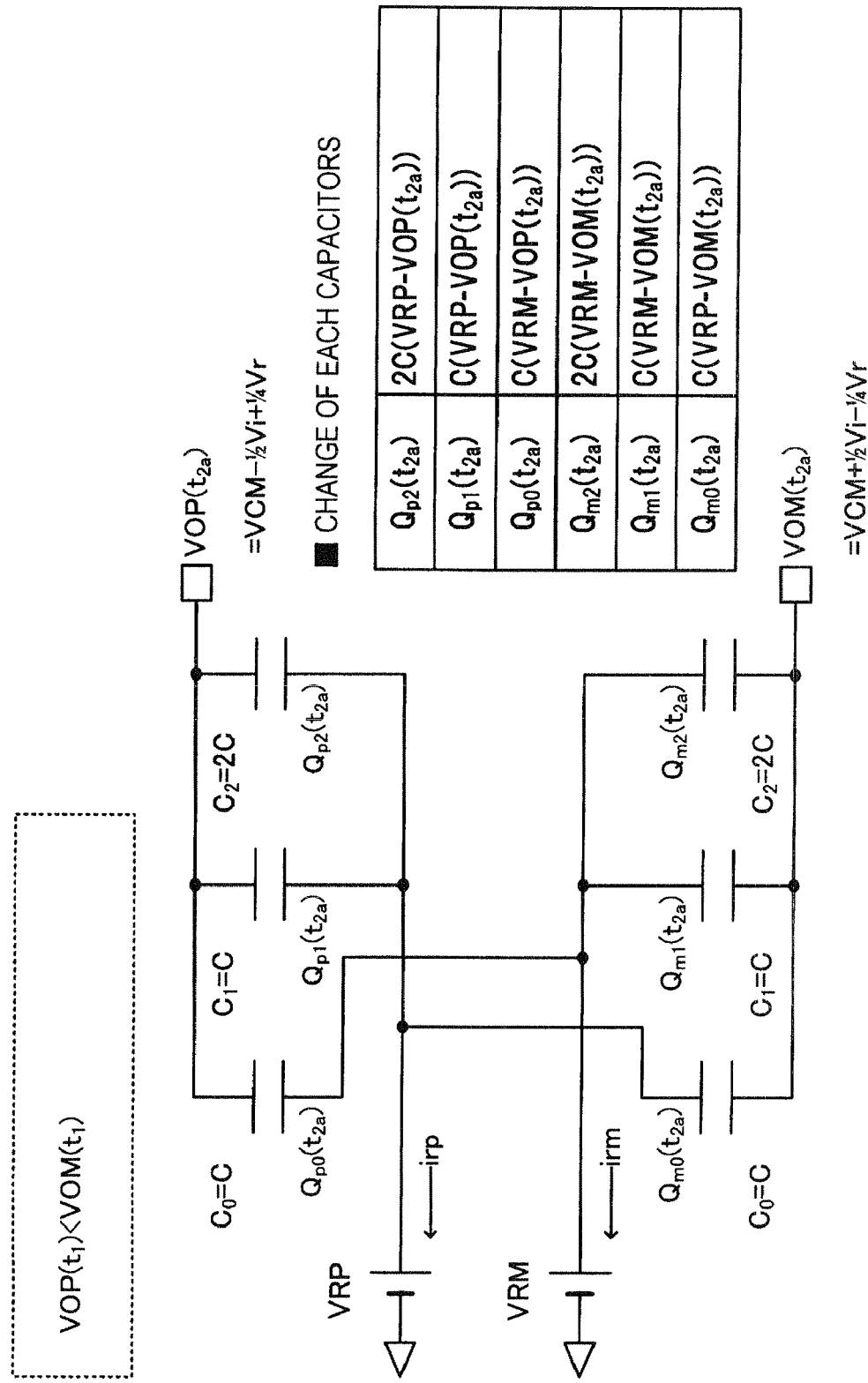

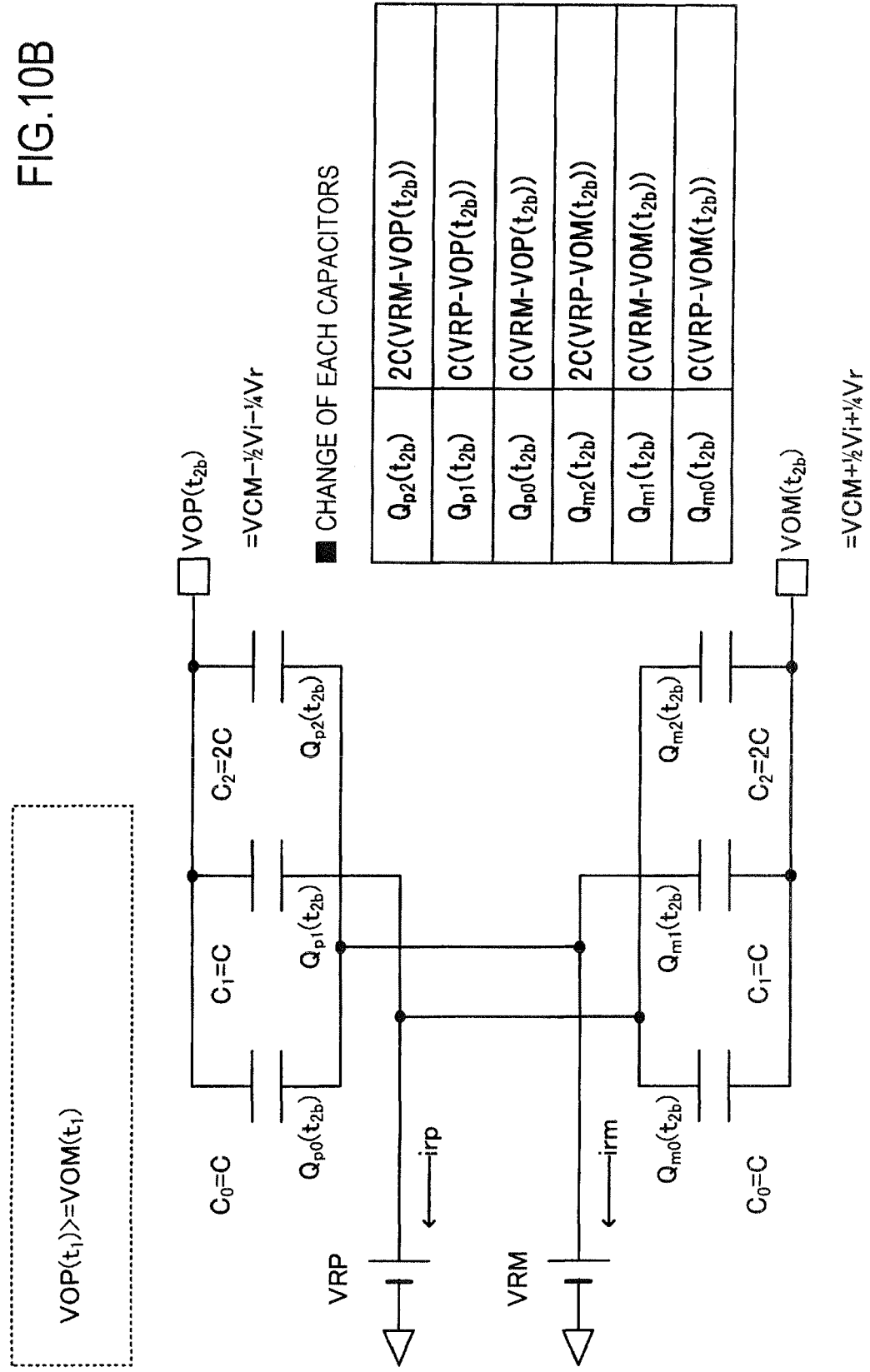

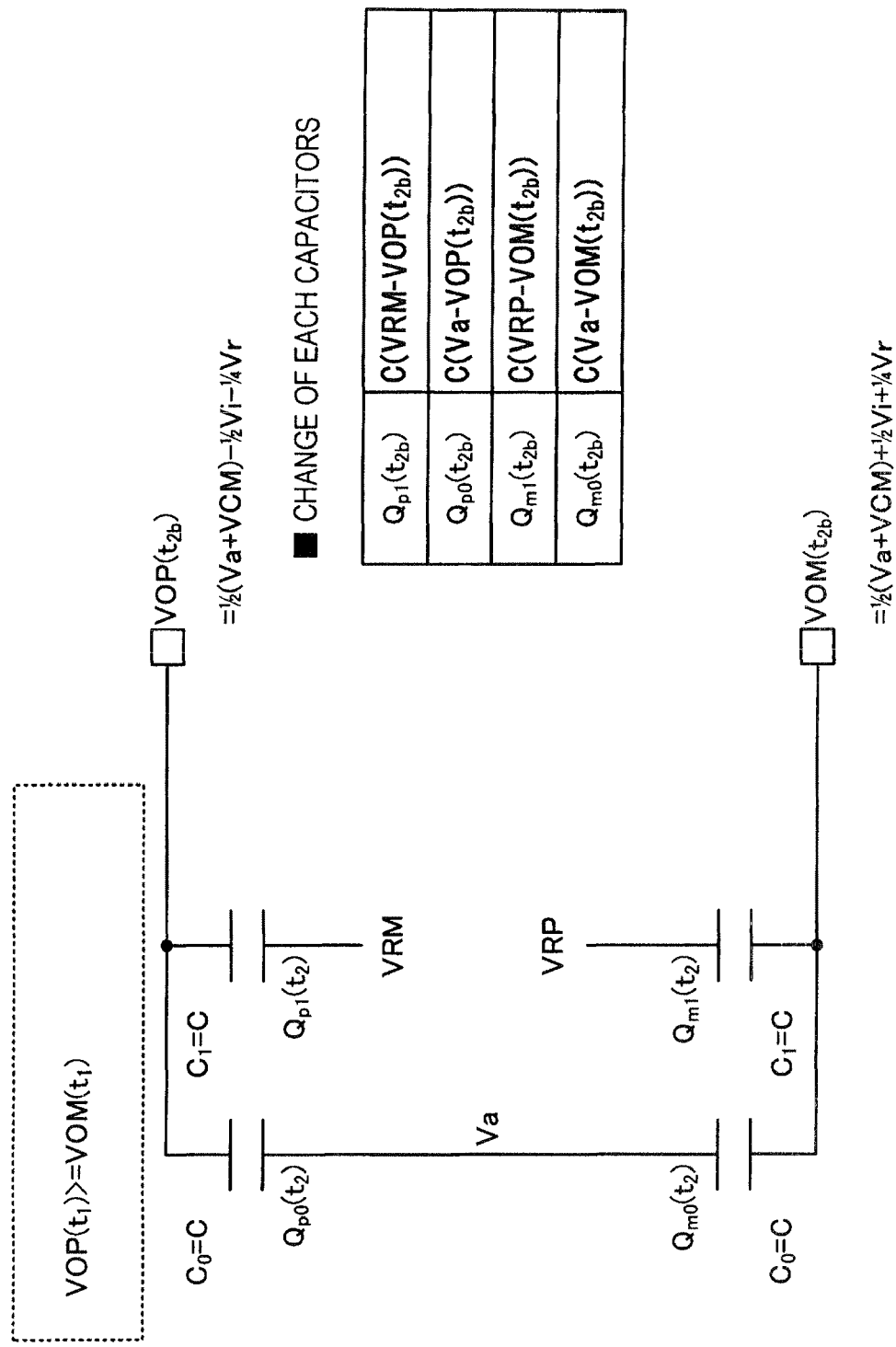

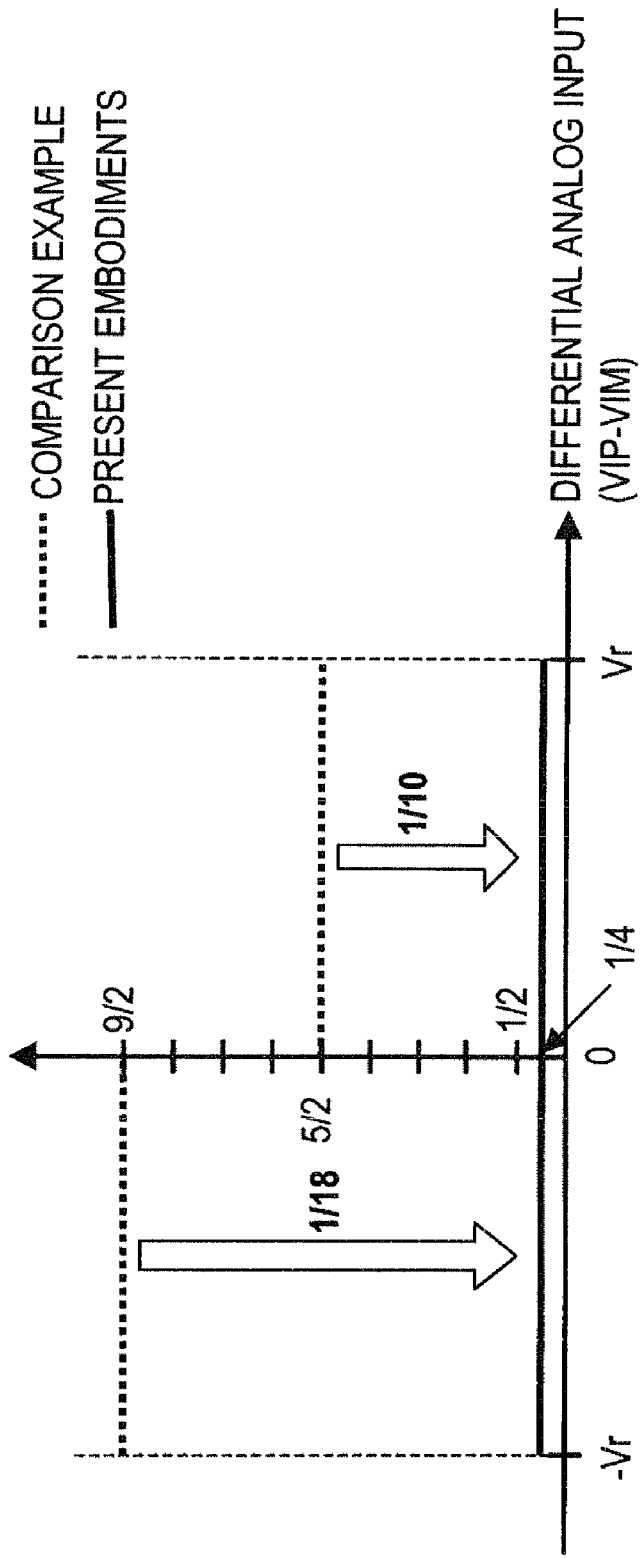

CHARGE REDISTRIBUTION DIGITAL-TO-ANALOG CONVERTER, AND SUCCESSIVE APPROXIMATION REGISTER ANALOG-TO-DIGITAL CONVERTER HAVING THE SAME

CROSS-REFERENCE TO RELATED APPLICATION

This application is based upon and claims the benefit of priority from the prior Japanese Patent Application No. 2009-101968, filed on Apr. 20, 2009, the entire contents of which are incorporated herein by reference.

FIELD

The present invention relates to a charge redistribution digital-to-analog converter, and a successive approximation register analog-to-digital converter having the same.

BACKGROUND

The successive approximation register analog-to-digital converter (hereafter referred to as "SAR ADC") converts an analog input signal to an n-bit digital output signal. A system LSI such as a communication receiver unit has a differential type SAR ADC, and the above SAR ADC converts the polarity and the differential voltage of a differential analog input signal to a digital output signal. Then, an incorporated digital processing circuit performs desired processing, such as demodulation processing and decoding processing, to the digital output signal.

The above successive approximation register analog-to-digital converter (SAR ADC) includes a charge redistribution digital-to-analog converter (hereafter referred to as "charge redistribution DAC" or "CDAC") for making a sampling voltage successively change after sampling the differential analog input signal according to a successive comparison result, a comparator for comparing the differential analog output signal, and a control circuit for supplying control digital signals to a digital-to-analog converter according to the comparison result by the comparator.

The following patent documents 1-4 disclose such converters.

Patent document 1 is the official gazette of the Japanese Unexamined Patent Publication No. 2007-142863.

Patent document 2 is the official gazette of the Japanese Unexamined Patent Publication No. 2006-503495.

Patent document 3 is the official gazette of the Japanese Unexamined Patent Publication No. 2003-152541.

Patent document 4 is the official gazette of the Japanese Unexamined Patent Publication No. Hei-6-164399.

In the SAR ADC described in the patent document 1 etc., in case of n bits, the operating speed to charge/discharge a capacitor is n times as high as a sampling frequency, or more. Further, power consumption by a charge/discharge current becomes greater as the speed becomes higher or the resolution becomes higher, and an occupation area by a capacitor inside the LSI is increased.

Further, accompanying charge transfer, the performance of the analog-to-digital converter in which high speed and high accuracy is required becomes deteriorated.

SUMMARY

Accordingly, it is an object of the present invention to provide a charge redistribution DAC having a suppressed charge/discharge current from a reference voltage, and a successive approximation register ADC having the above charge redistribution DAC.

A digital-to-analog converter of an embodiment includes a plus-side input terminal and a minus-side input terminal for inputting differential analog signals; a plus-side reference voltage terminal and a minus-side reference voltage terminal; a plus-side digital-to-analog converter including a plurality of plus-side capacitors having capacitance values weighted by the powers of two, a plus-side output terminal connected to first electrodes of the plurality of plus-side capacitors, and according to plus-side control digital signals, a plurality of plus-side switches for connecting each second electrode of the plurality of plus-side capacitors to the plus-side input terminal and to either the plus-side reference voltage terminal or the minus-side reference voltage terminal; a minus-side digital-to-analog converter including a plurality of minus-side capacitors having capacitance values weighted by the powers of two, a minus-side output terminal connected to first electrodes of the plurality of minus-side capacitors, and according to minus-side control digital signals, a plurality of minus-side switches for connecting each second electrode of the plurality of minus-side capacitors to the minus-side input terminal and to either the plus-side reference voltage terminal or the minus-side reference voltage terminal; and a plurality of short-circuit switches provided between at least identically weighted plus-side capacitors and minus-side capacitors. And, at the time of sampling, the plus-side and minus-side switches connect the second electrodes of the plus-side and minus-side capacitors to the plus-side and minus-side input terminals, respectively, and, after the sampling, the plurality of short-circuit switches short-circuit between the second electrodes of the plus-side and minus-side capacitors.

According to the above-mentioned aspect, it is possible to provide a DAC having suppressed power consumption. Also, it is possible to provide a DAC having a reduced capacitor area.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a diagram illustrating the connection state of the capacitor group of the differential DAC and the charge state of each capacitor, during the period of the comparison operation Comp2.

FIG. 22 is a diagram illustrating consumption power in the present embodiment and the comparison example.

DESCRIPTION OF EMBODIMENTS

A CDAC incorporated in an SAR ADC includes a plurality of array capacitors having capacitance values weighted at a predetermined ratio, an analog output terminal connected in common to the array capacitors, and a switch group provided at the opposite side of the output terminal of each array capacitor, for connecting the array capacitors to either one of an analog input signal, a plus-side reference voltage or a minus-side reference voltage in response to a digital input signal. Further, a differential SAR ADC includes CDACs, each having the above array capacitors and the switch group, both on the plus side and on the minus side. At the sampling time of the SAR ADC, a differential analog input signal is applied to the entire capacitors of the CDAC, so that charge corresponding to the input signal is stored. Thereafter, in response to control digital signals from a control circuit, the switch group is controlled to vary the voltage of the common output terminal, and then, the above common output terminal voltage is compared by a comparator. The above comparison operation is repeated from the uppermost bit to the lowest bit.

In the SAR ADC described in the patent document 1 etc., each time of the comparison operation, the switch group in the CDAC is controlled ON and OFF, and the corresponding capacitors are recharged/discharged by the plus-side reference voltage and the minus-side reference voltage, so that the charge is transferred to the corresponding capacitor. The operating speed of the above charge/discharge is n times as high as sampling frequency or more, in the case of n bits. Also, as the number of bits in the SAR ADC increases and the resolution becomes higher, the weighted capacitance value (capacitance) of the capacitors becomes larger. Accordingly, as the speed becomes higher and the resolution becomes larger, power consumption by a charge/discharge current becomes larger, and the area occupied by capacitors inside an LSI is increased accordingly.

Further, accompanying the charge transfer, from an external reference voltage source, a high-frequency charge/discharge current flows into inductance, such as lead terminals and bonding wires in the LSI having the embedded SAR ADC, and a ringing noise is produced. This causes deteriorated performance of an analog-to-digital converter in which high speed and high accuracy are required.

Figure 1:
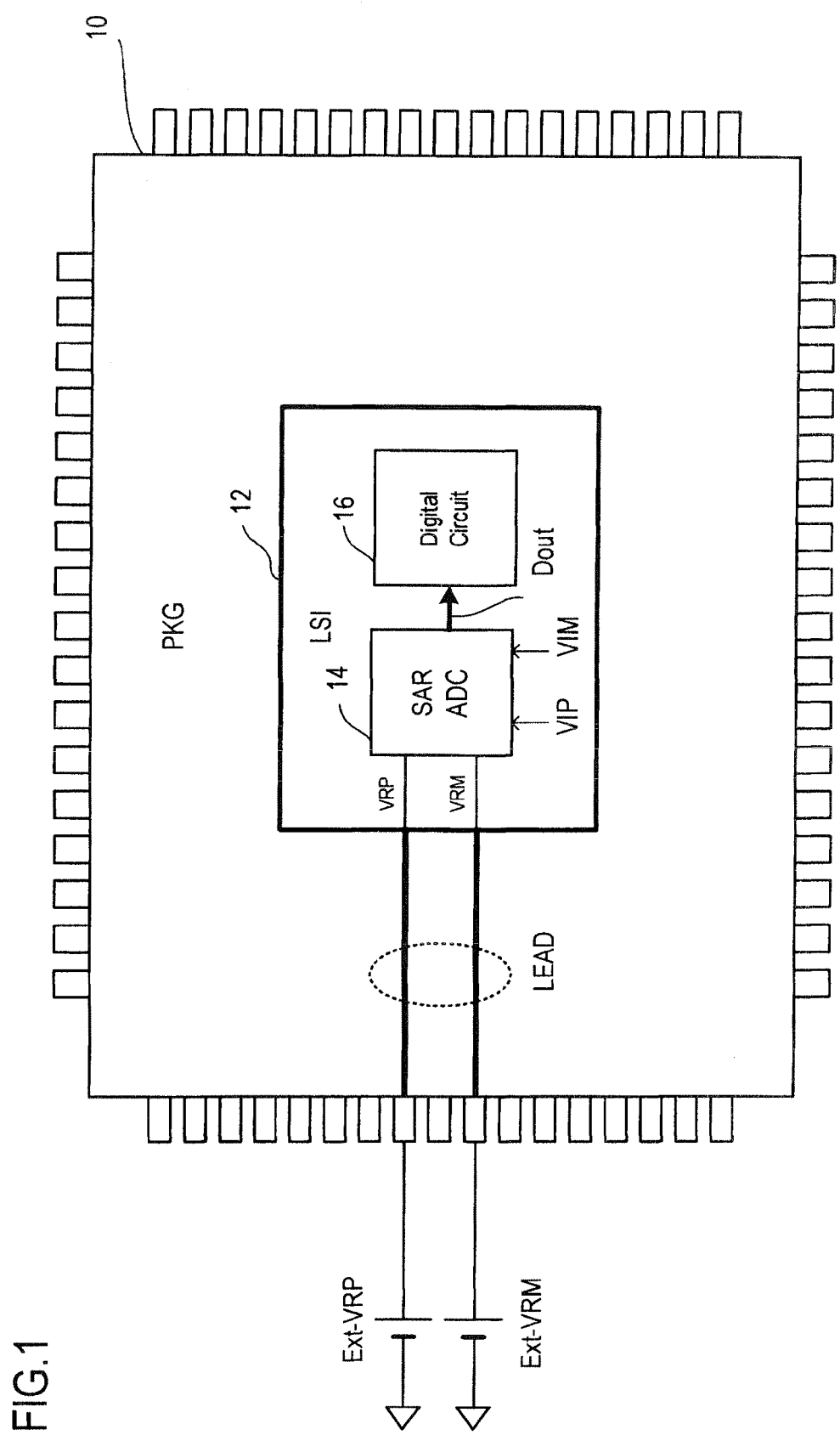
FIG. 1 is a diagram illustrating an exemplary configuration of a semiconductor device, having the analog-to-digital converter (ADC) embedded therein, according to the present embodiment.

FIG. 1 is a diagram illustrating an exemplary configuration of a semiconductor device, having the analog-to-digital converter (ADC) embedded therein, according to the present embodiment. A semi conductor device 10 accommodates an LSI 12 in a package PKG. In the LSI, there are provided a successive approximation register ADC 14 for inputting differential input signals VIP, VIM and for converting them to a digital output signal Dout, and a digital signal processing circuit 16 for performing desired processing to the above digital output signal Dout. To ADC 14, a plus-side reference voltage VRP and a minus-side reference voltage VRM are supplied as reference voltages, from external reference voltage sources Ext-VRP, Ext-VRM, via lead terminals LEAD and bonding wires (not shown) in the package.

[Outline of a Differential Successive Approximation Register ADC]

Figure 2:
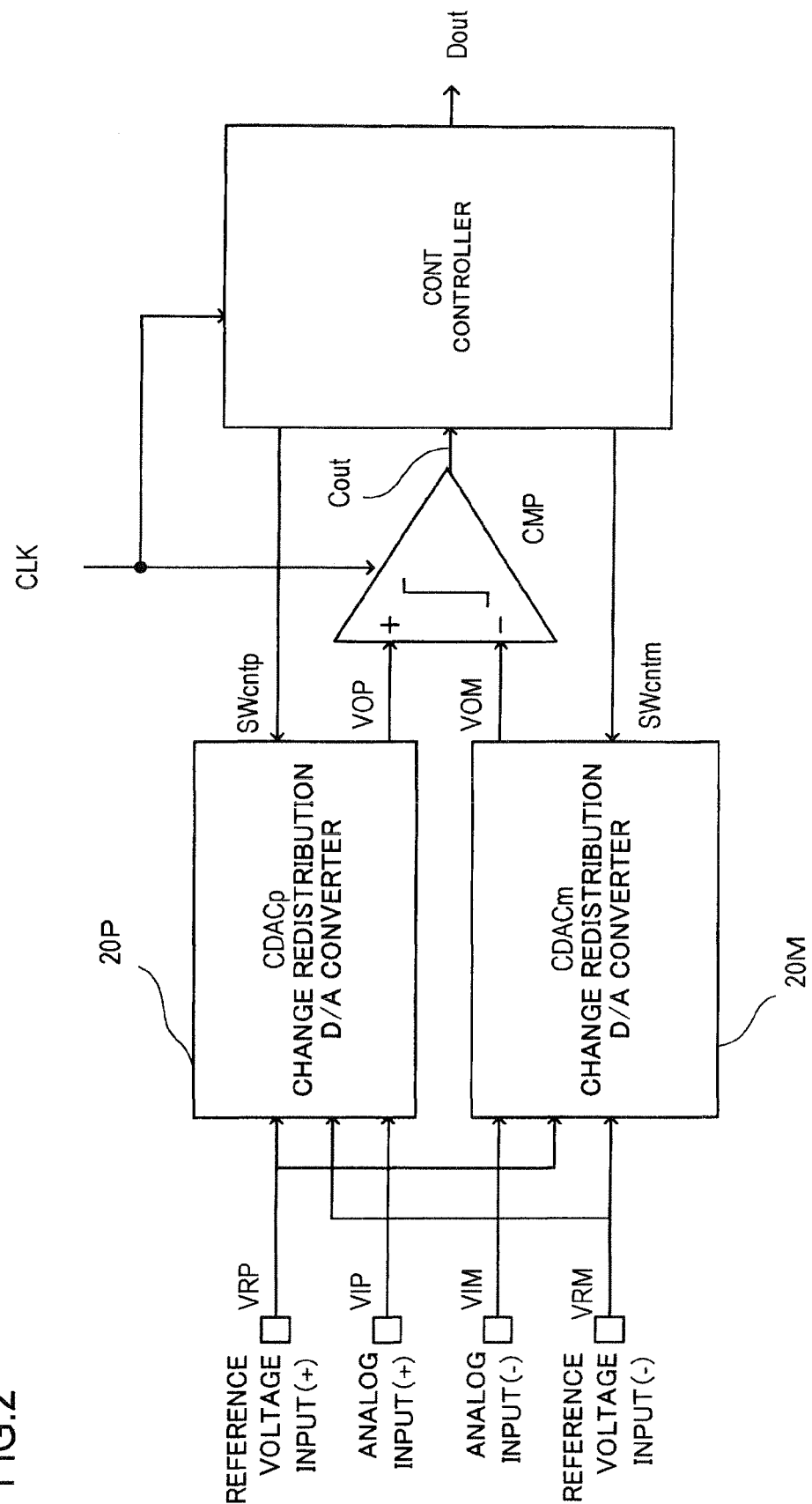
FIG. 2 is an overall configuration diagram of a differential successive approximation register ADC according to the present embodiment.

FIG. 2 is an overall configuration diagram of a differential successive approximation register ADC according to the present embodiment. This differential successive approximation register ADC (SAR ADC) converts a differential voltage of a plus-side analog input signal VIP and a minus-side analog input signal VIM to an n-bit (n is a plural number) digital output signal Dout. The above digital output signal Dout includes a sign bit, which is information indicating which of the plus-side and minus-side analog input signals VIP, VIM has a higher or lower potential, and differential operation bits indicating a voltage difference between signals VIP and VIM, namely amplitude information. Therefore, a conversion scale of the SAR ADC is +|VIP−VIM| to −|VIP−VIM|.

The SAR ADC includes a plus-side input terminal VIP and a minus-side input terminal VIM for inputting differential analog signals, a plus-side reference voltage terminal VRP, a minus-side reference voltage terminal VRM, a plus-side digital-to-analog converter (CDACp) 20P, a minus-side digital-to-analog converter (CDACm) 20M, a comparator CMP for comparing analog output voltages VOP, VOM of the both CDACs 20P, 20M, and a control circuit CONT for inputting a comparison output Cout, which is a comparison result of the comparator, for generating a digital output signal Dout by storing the comparison result, and for generating a plus-side control digital signal SWcntp and a minus-side control digital signal SWcntm according to the comparison result. In synchronization with a synchronous clock CLK, the comparator CMP and the control circuit CONT repeat n-bit comparison operation.

Figure 3:
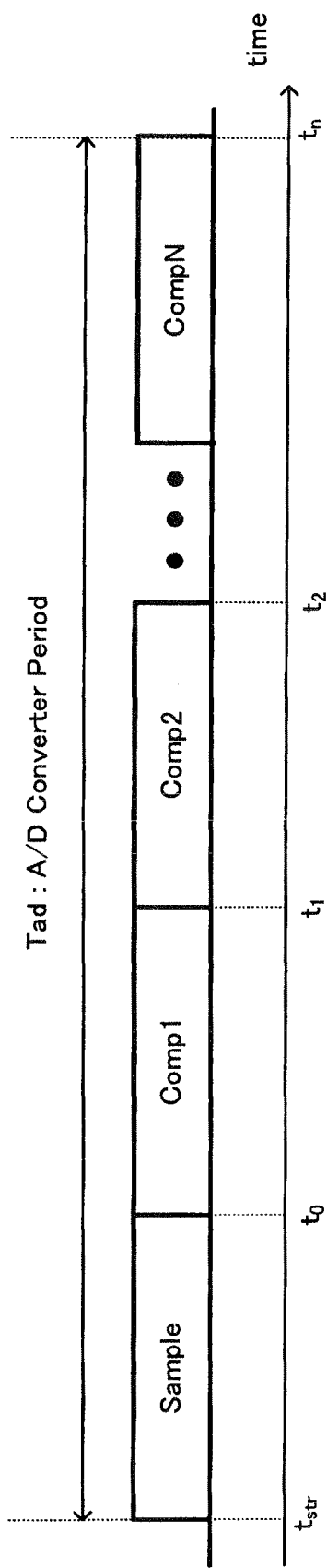
FIG. 3 is a diagram illustrating analog-to-digital conversion operation in the successive approximation register ADC.

FIG. 3 is a diagram illustrating analog-to-digital conversion operation in the successive approximation register ADC.

Corresponding to a time axis shown by the horizontal axis, an A/D converter period Tad is from a sample operation at an A/D conversion start time $t_{str}$ to the completion of comparison operation at the n-th bit at $t_n$.

Figure 4:
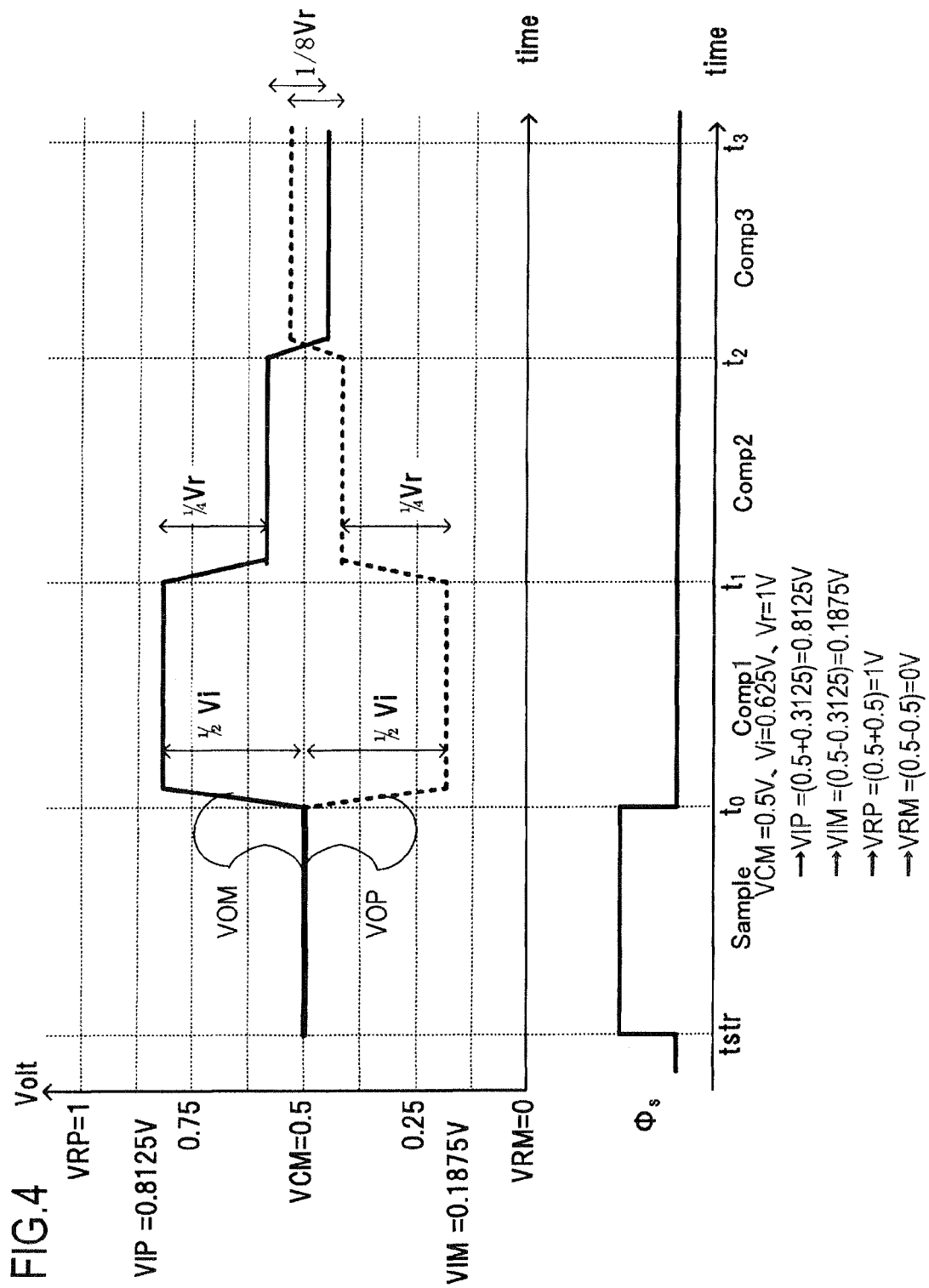
FIG. 4 is a diagram illustrating one example of the analog-to-digital conversion operation in the successive approximation register ADC.

FIG. 4 is a diagram illustrating one example of the analog-to-digital conversion operation in the successive approximation register ADC. In this example, each differential analog input signal VIP, VIM has a potential shown in the figure, namely, a potential between the plus-side reference voltage VRP=1 V and the minus-side reference voltage VRM=0 V, and a potential different from a common-phase voltage VCM=0.5 V, which is an intermediate potential between the reference voltages VRP, VRM, by ±Vi/2 (Vi is an amplitude, a voltage difference, of the differential signal). Also, a difference voltage Vr between both reference voltages VRP, VRM becomes Vr=1 V, and therefore, differs from the common-phase voltage VCM by ±Vr/2. Namely, VIP=VCM+Vi/2
VIM=VCM−Vi/2
VRP=VCM+Vr/2
VRM=VCM−Vr/2

In the following, the outline of analog-to-digital conversion operation will be described by reference to FIG. 3 and FIG. 4.

First, during the time $t_{str}$–$t_0$, the plus-side CDACp samples voltage information of the plus-side analog input signal VIP, while the minus-side CDACm samples voltage information of the minus-side analog input signal VIM. By the above sampling operation, charge according to the analog input signals VIP, VIM is stored in the array capacitors of the CDACp, CDACm. More specifically, each capacitor in the CDACp stores charge according to a voltage VIP−VCM=+Vi/2, and each capacitor in the CDACm stores charge according to a voltage VIM−VCM=−Vi/2. Both analog outputs VOP, VOM in the above sampling period have the common-phase voltage VCM.

Next, in a comparison operation Comp1 for the first bit during the time $t_0$–$t_1$, the control circuit CONT generates predetermined control digital signals SWcntp, SWcntm. Also, CDACp and CDACm respectively output analog output signals VOP, VOM according to the analog input signals VIP, VIM. In the example shown in FIG. 4, $$VOP=VCM-Vi/2 \quad (1)$$

$$VOM=VCM+Vi/2 \quad (2)$$

are output. Here, since VIP−VIM=Vi, if VIP>VIM, Vi>0 holds, while if VIP<VIM, Vi<0 holds. The above analog output signals VOP, VOM are compared by the comparator CMP, and the comparison result is output as a comparison output Cout. Based on the above comparison output Cout, the control circuit CONT memorizes a sign bit indicating which potential of the differential analog input signals VIP, VIM is higher or lower, as a first bit of a digital output signal Dout. In the example shown in FIG. 4, because VIP>VIM and Vi>0, VOP<VOM is obtained, and the comparison result Cout becomes L level. By inverting the above comparison result Cout=L (or 0), the control circuit CONT memorizes the first bit to be H level (or 1). If VIP<VIM, then VOP>VOM is obtained, resulting in Cout=H (or 1). Here, the comparison result Cout is inverted from the conversion bit logic merely due to the comparator configuration, and it is not always necessary to invert in case of a different configuration of the comparator.

In comparison operation Comp2 for the second bit during the time $t_1$–$t_2$, the control circuit CONT generates control digital signals SWcntp, SWcntm according to the comparison output Cout of the first bit. In the example shown in FIG. 4, because the comparison output Cout of the first bit=L (or 0), based on the control digital signals, the CDACp increases the analog output signal VOP by Vr/4, while CDACm decreases the analog output signal VOM by Vr/4. As a result, $$VOP=VCM-Vi/2+Vr/4 \quad (3)$$

$$VOM=VCM+Vi/2-Vr/4 \quad (4)$$

are output. The comparator CMP compares the above analog output signals VOP, VOM, and the control circuit CONT memorizes a second bit based on the comparison output Cout. In the example shown in FIG. 4, because the differential voltage (voltage difference) of the analog input signals is VIP−VIM=Vi>Vr/2, even if the analog output signals VOP, VOM are shifted by ±Vr/4, VOP<VOM holds. Therefore, the comparison result Cout of the second bit corresponding to the most significant bit of the differential voltage becomes L level (or 0). Based on the above comparison result Cout=L, the control circuit CONT memorizes the second bit to be H level (or 1).

In the comparison operation Comp3 for the third bit during the time $t_2$–$t_3$, the control circuit CONT generates control digital signals SWcntp, SWcntm according to the comparison output Cout of the second bit. In the example shown in FIG. 4, because the comparison output Cout of the second bit=L (or 0), based on the control digital signals, CDACp increases the analog output signal VOP by Vr/8, while CDACm decreases the analog output signal VOM by Vr/8. As a result, $$VOP=VCM-Vi/2+Vr/4+Vr/8 \quad (5)$$

$$VOM=VCM+Vi/2-Vr/4-Vr/8 \quad (6)$$

are output. The comparator CMP compares between the above analog output signals VOP, VOM, and the control circuit CONT memorizes the third bit based on the comparison output Cout. In the example shown in FIG. 4, because the differential voltage (voltage difference) of the analog input signals is Vr/2<VIP−VIM=Vi<3Vr/4, if the analog output signals VOP, VOM are shifted by ±Vr/8, a reversed result, that is VOP>VOM, is obtained. Therefore, the comparison result Cout of the third bit corresponding to the second upper bit of the differential voltage becomes H level (or 1). Based on the above comparison result Cout=H, the control circuit CONT memorizes the third bit to be L level (or 0).

Although not shown in the figure, because the comparison result of the third bit became H level, in the comparison operation for the fourth bit, the following analog output signals VOP, VOM are generated by means of the control digital signals, which are then compared in the comparator.

$$VOP=VCM-Vi/2+Vr/4+Vr/8-Vr/16$$

$$VOM=VCM+Vi/2-Vr/4-Vr/8+Vr/16$$

Namely, VOP is decreased by Vr/16, and VOM is increased by Vr/16.

By the repetition of the above comparison operation, at the time $t_n$ when the comparison operation CompN for the n-th bit of the least significant bit is completed, A/D conversion operation by the SAR ADC is completed.

As described above, in the comparison operation for the first bit, the SAR ADC generates analog output signals VOP, VOM shown in expressions (1), (2), and detects high/low relationship between the differential analog input signals VIP, VIM, as a sign bit. Further, thereafter, the SAR ADC generates control digital signals SWcntp, SWcntm according to the comparison result Cout, and as described in expressions (3), (4) and expressions (5), (6), the SAR ADC reduces the voltage difference between the analog output signals VOP, VOM by the step of $Vr/2^{k-1}$ (for the k-th bit), like $Vr/2$, $Vr/4$, ..., and detects the relationship of magnitude between the VOP, VOM by the comparator CMP. Then, in the comparison operation for the k-th bit, if the comparison result Cout of the comparison operation Comp1=L holds as shown by the comparison operation Comp2 in FIG. 4, the SAR ADC varies the analog output signals VOP, VOM by $\pm Vr/2^{k-1}$ in an identical direction. On the other hand, as shown by the comparison operation Comp3 in FIG. 4, if the comparison result Cout of the comparison operation Comp2=H holds, the SAR ADC varies the analog output signals VOP, VOM by $\pm Vr/2^{k-1}$ in the opposite direction. By this, the SAR ADC successively compares and detects from the most significant bit to the least significant bit.

According to the present embodiment, an improved example of differential CDACs, namely, a plus-side CDACp and a minus-side CDACm in a differential successive approximation register ADC has been shown. Accompanying this, the control digital signals are also improved.

Hereafter, in regard to the configuration and the operation of the differential successive approximation register ADC, a comparison example and the present embodiment will be described. The SAR ADC shown as the comparison example resembles the SAR ADC described in the patent document 1, for example.

Comparison Example of the Differential Successive Approximation Register ADC

Figure 5:
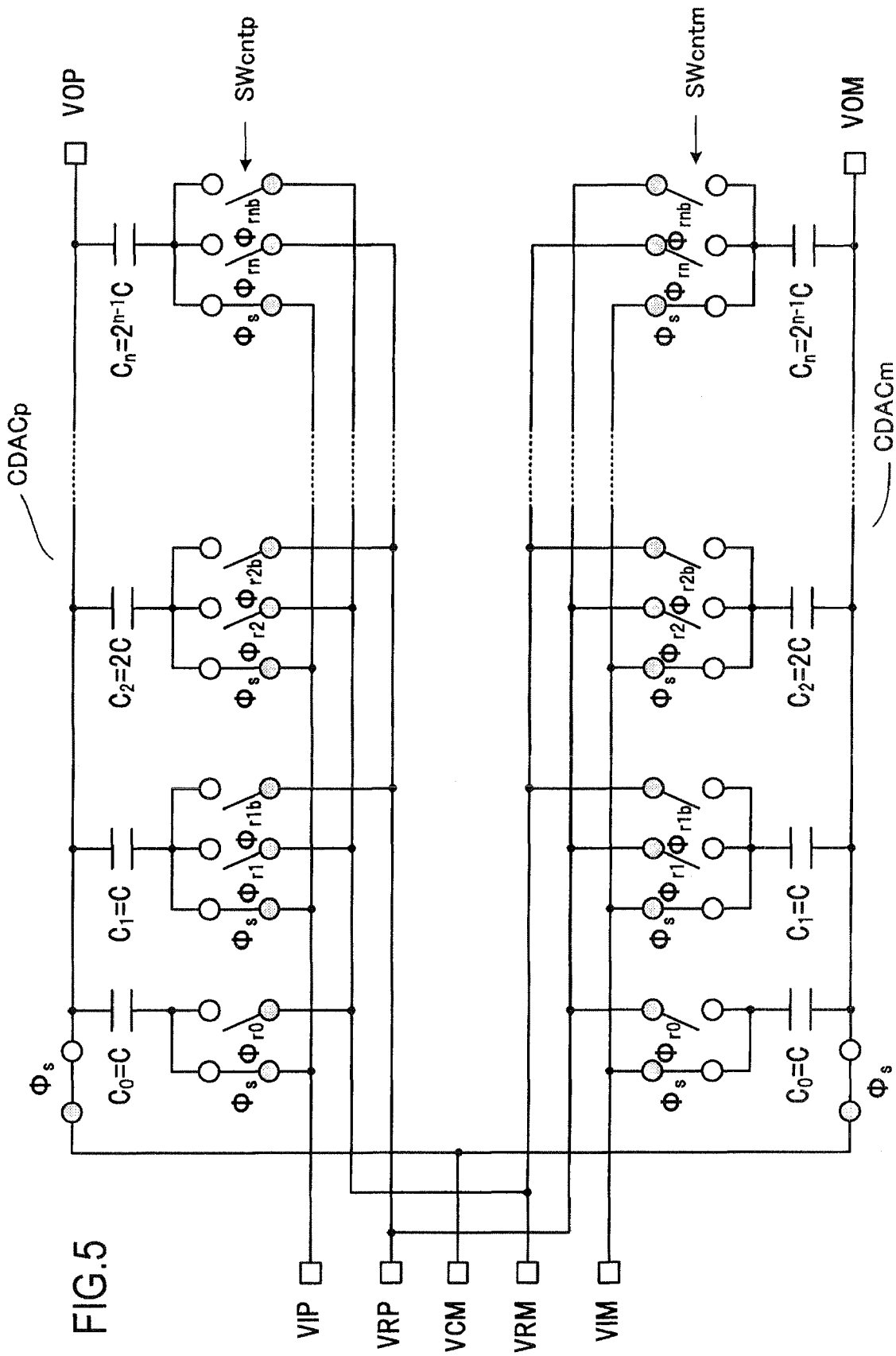
FIG. 5 is a circuit diagram of a differential DAC included in the comparison example of the differential successive approximation register ADC.

FIG. 5 is a circuit diagram of a differential DAC included in the comparison example of the differential successive approximation register ADC. The above differential DAC is an all-differential n-bit CDAC having a plus-side CDACp and a minus-side CDACm.

The plus-side CDACp includes the plus side N capacitors $C_1-C_n$, having capacitance values C, 2C, 4C ... $2^{n-1}C$ weighted by the powers of 2 (where capacity C signifies the capacitance value of a minimum unit); a plus-side analog output terminal VOP connected to each first electrode of the plus-side capacitors $C_1-C_n$; and a plurality of plus-side switches $\phi_s$, $\phi_{r0}$, $\phi_{r1b}-\phi_{rn}$ and $\phi_{rnb}$ each connecting each second electrode of the plus-side capacitors $C_1-C_n$ to either one of a plus-side analog input terminal VIP, a plus-side reference voltage terminal VRP and a minus-side reference voltage terminal VRM. The above plus-side switches are controlled to be conductive (ON) or non-conductive (OFF) according to the plus-side control digital signals $\phi_s$, $\phi_{r0}$, $\phi_{r1}$, $\phi_{r1b}-\phi_{rn}$ and $\phi_{rnb}$. Further, the plus-side CDACp includes a switch $\phi_s$, which is set ON at the time of sampling. For the sake of simplicity, the citation symbol of each switch is made identical to the citation symbol of each control digital signal for controlling the switch. Also, hereafter, if $\phi$=H (or 1), the switch $\phi$ is set ON, while if $\phi$=L (or 0), the switch $\phi$ is set OFF. Additionally, in the case of the comparison example, the connection relationship of the uppermost-level switches $\phi_{rn}$ and $\phi_{rnb}$ to the reference voltages VRP, VRM is made to be opposite to the connection relationship of the other lower-level switches $\phi_{r1}$, $\phi_{r1b}-\phi_{rn-1}$ and $\phi_{rn-1b}$.

The plus-side CDACp further includes a plus-side auxiliary capacitor $C_0$ having the minimum capacitance value C. With the provision of the above auxiliary capacitor $C_0$, a conversion error is eliminated. Thus, in the case of n-bit CDAC of the comparison example, by the addition of the auxiliary capacitor, n+1 capacitors are respectively provided on the plus side and on the minus side.

The minus-side CDACm has a similar configuration to the plus-side CDACp, and includes the minus side N capacitors $C_1-C_n$ having capacitance values weighted by the powers of 2; a minus-side analog output terminal VOM connected to each first electrode of the minus-side capacitors $C_1-C_n$; and according to minus-side control digital signals $\phi_s$, $\phi_{r0}$, $\phi_{r1}$, $\phi_{r1b}-\phi_{rn}$ and $\phi_{rnb}$, a plurality of switches $\phi_s$, $\phi_{r0}$, $\phi_{r1}$, $\phi_{r1b}-\phi_{rn}$ and $\phi_{rnb}$ for connecting each second electrode of the minus-side capacitors to either one of a minus-side analog input terminal VIM, the plus-side reference voltage terminal VRP and the minus-side reference voltage terminal VRM. Further, the minus-side CDACm includes a minus-side auxiliary capacitor $C_0$ and a switch $\phi_s$ which is set ON at the time of sampling.

As such, as contrasted to the plus-side CDACp, in the minus-side CDACm, the minus-side analog input terminal VIM is used in place of the plus-side analog input terminal VIP, and the minus-side analog output terminal VOM is used in place of the plus-side analog output terminal VOP, respectively. Also, in the minus-side CDACm, the connection relationship between the reference voltage terminals VRP, VRM is opposite to the connection relationship in the plus-side CDACp. The plus-side control digital signals and the minus-side control digital signals having identical citation symbols indicate identical signals.

The differential successive approximation register ADC in the comparison example has the same overall configuration as the configuration shown in FIG. 2, and includes the all-differential CDAC shown in FIG. 5, as CDACp and CDACm.

Figure 6:
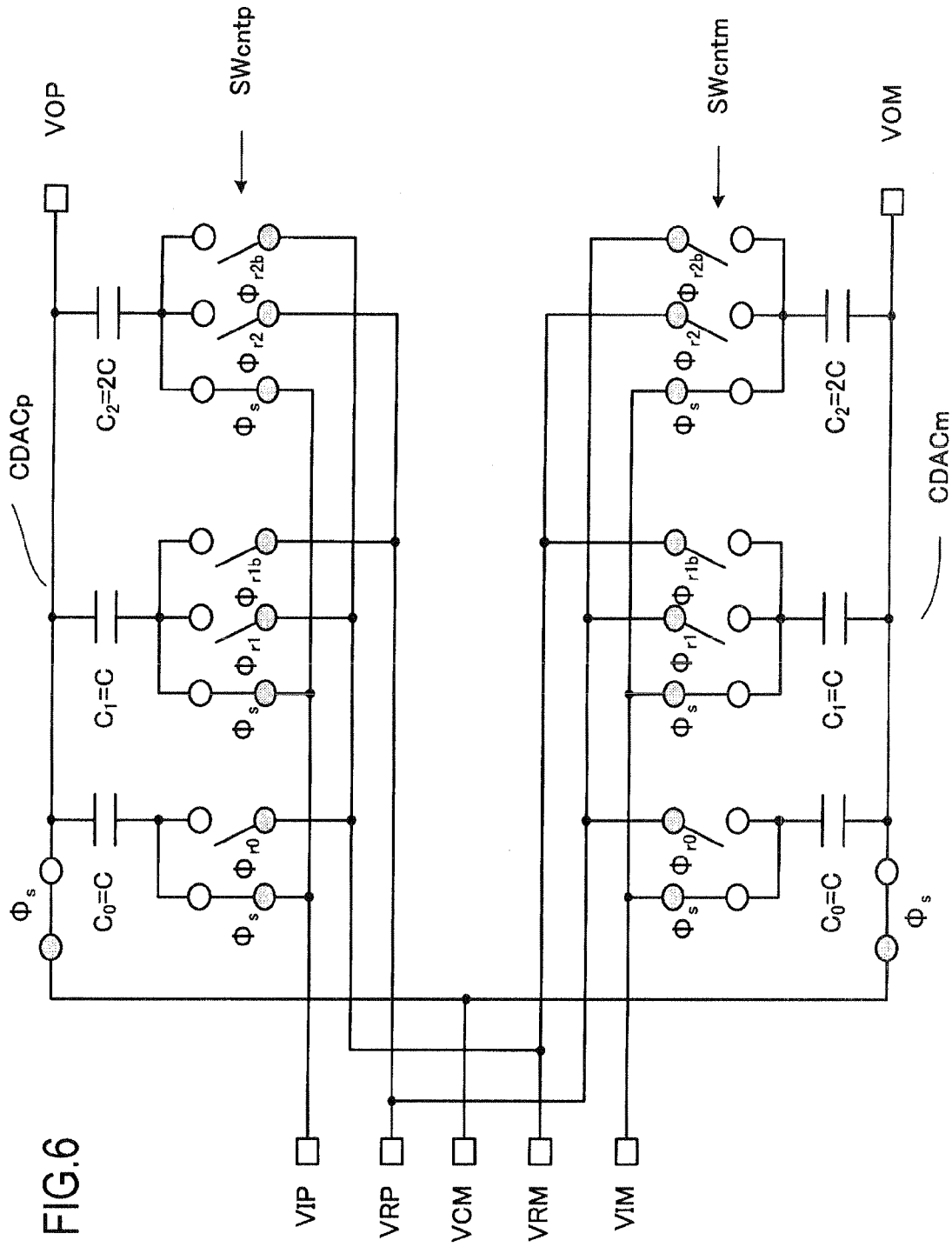
FIG. 6 is a configuration diagram of a 2-bit differential DAC provided in the comparison example of the differential successive approximation register ADC.
Figure 7:
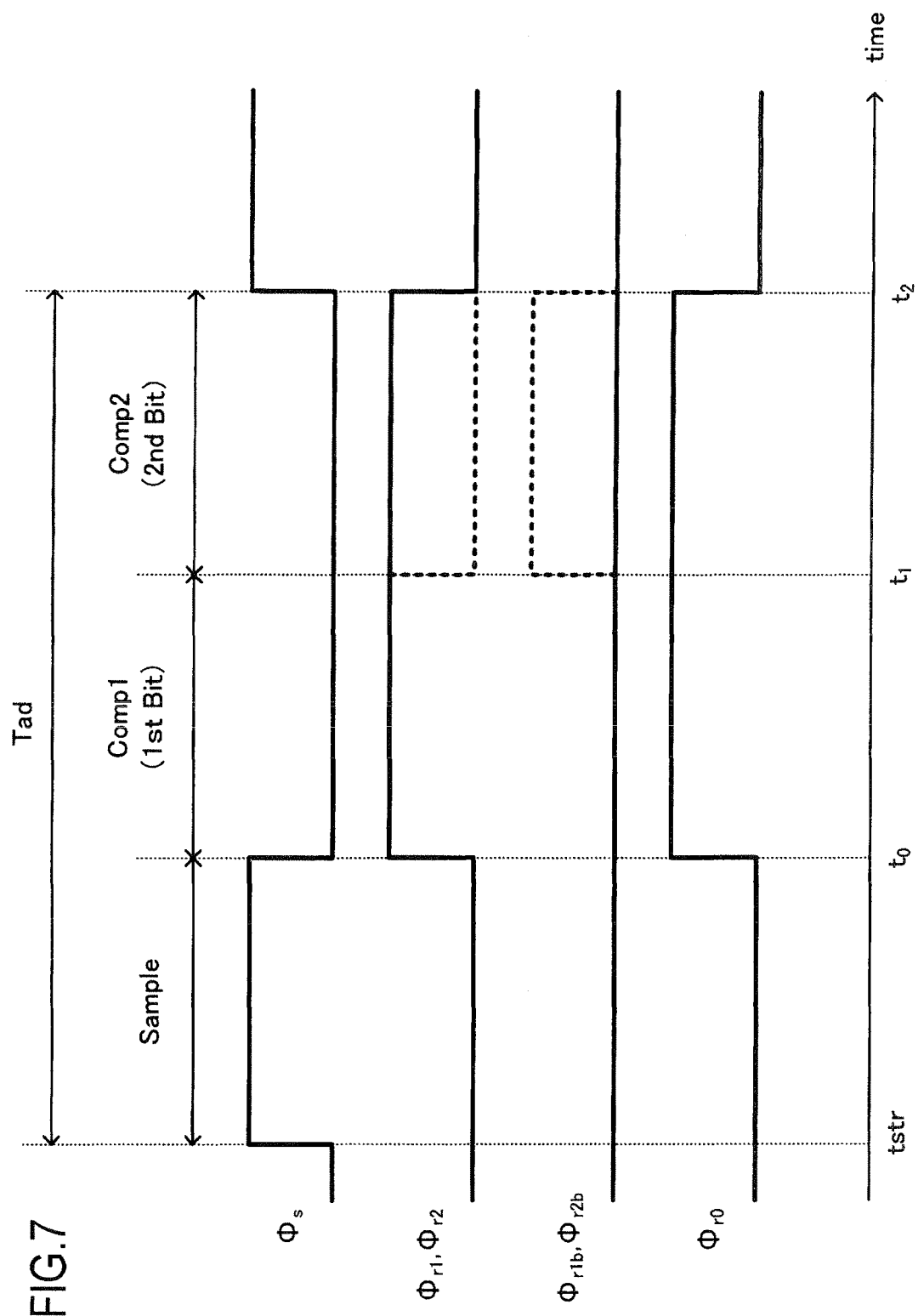
FIG. 7 is a diagram illustrating the operation of FIG. 6.

FIG. 6 is a configuration diagram of a 2-bit differential DAC provided in the comparison example of the differential successive approximation register ADC. Also, FIG. 7 is a diagram illustrating the operation of FIG. 6. Since the differential DAC shown in FIG. 6 has a 2-bit configuration, the plus-side and minus-side capacitors are constituted of the auxiliary capacitor $C_0$ and two capacitors $C_1$, $C_2$, respectively. For the sake of simple explanation, the operation of the all-differential 2-bit CDAC will be described in the following.

As a prerequisite, differential analog input voltages VIP, VIM are as follows.

$$VIP=VCM+Vi/2 \quad (7)$$

$$VIM=VCM-Vi/2 \quad (8)$$

Here, VCM is a common-phase voltage and Vi is a differential voltage.

Also, the plus-side and minus-side reference voltages VRP, VRM are as follows.

$$VRP=VCM+Vr/2 \quad (9)$$

$$VRM=VCM-Vr/2 \quad (10)$$

Here, Vr is a differential voltage between the reference voltages VRP and VRM.

Further, in the following, it is assumed that when a control digital signal $\phi$=1, the related switch becomes ON, while when $\phi$=0, the switch becomes OFF.

[Sampling Period]

In the sampling period of the time $t_{str}-t_0$, as shown in FIG. 7, the minus-side and plus-side control digital signals $\phi_s$, $\phi_{r0}$, $\phi_{r1}$, $\phi_{r1b}$, $\phi_{r2}$ and $\phi_{r2b}$ become $$\phi_s, \phi_{r0}, \phi_{r1}, \phi_{r1b}, \phi_{r2}, \phi_{r2b}=1,0,0,0,0,0$$

and as shown in FIG. 6, only the switch $\phi_s$ becomes ON, and the other switches become OFF. As a result, the plus-side analog output terminal VOP and the minus-side analog output terminal VOM, which are common nodes connected to the respective first electrodes of the capacitor group, are both connected to the common-phase voltage terminal VCM (VOP, VOM=VCM). Also, the plus-side analog input terminal VIP and the minus-side analog input terminal VIM are respectively connected to the second electrodes of the capacitor group.

Figure 8:
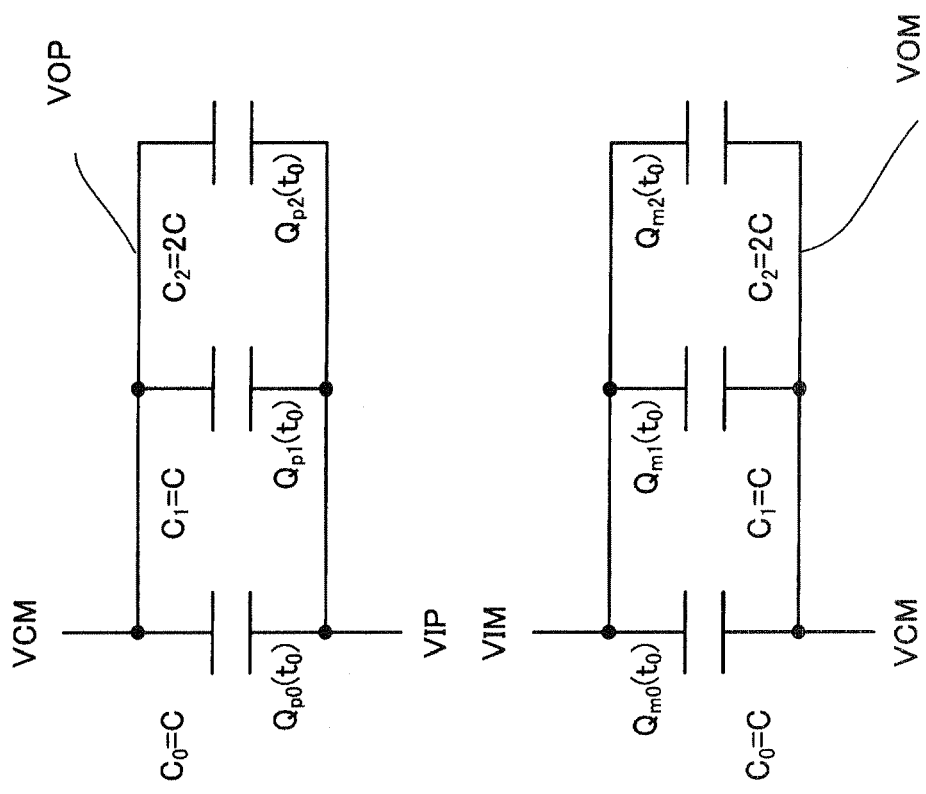
FIG. 8 is a diagram illustrating the connection state of the capacitor group and the charge state of each capacitor during the sampling period in the differential DAC

FIG. 8 is a diagram illustrating the connection state of the capacitor group and the charge state of each capacitor during the sampling period in the differential DAC. As shown in FIG. 8, VIP–VCM is applied to the plus-side capacitors $C_0$, $C_1$, $C_2$. At the time $t_0$ when the sampling period is completed, charges $Q_{p0}(t_0)$, $Q_{p1}(t_0)$ and $Q_{p2}(t_0)$ stored in the respective plus-side capacitors are as follows.

$$Q_{p2}(t_0)=2C(VIP-VCM) \quad (11)$$

$$Q_{p1}(t_0)=C(VIP-VCM) \quad (12)$$

$$Q_{p0}(t_0)=C(VIP-VCM) \quad (13)$$

Similarly, VIM–VCM is applied to the minus-side capacitors $C_0$, $C_1$, $C_2$. At the time $t_0$ when the sampling period is completed, charges $Q_{m0}(t_0)$, $Q_{m1}(t_0)$ and $Q_{m2}(t_0)$ stored in the respective minus-side capacitors are as follows.

$$Q_{m2}(t_0)=2C(VIM-VCM) \quad (14)$$

$$Q_{m1}(t_0)=C(VIM-VCM) \quad (15)$$

$$Q_{m0}(t_0)=C(VIM-VCM) \quad (16)$$

Next, in the comparison operations Comp1, Comp2 performed thereafter, the control digital signal $\phi_s=0$ is produced, and the switch $\phi_s$ becomes OFF, accordingly. Thus, both the analog output terminals VOP, VOM become floating states (high impedance states), and the charge at the first electrode of the capacitor group is conserved. On the other hand, because the control digital signal $\phi_{r0}=1$, the minus-side reference voltage VRM remains connected to the plus-side auxiliary capacitor $C_0$, and the plus-side reference voltage VRP remains connected to the minus-side auxiliary capacitor $C_0$, respectively.

[Comparison Operation Comp1]

Figure 9:
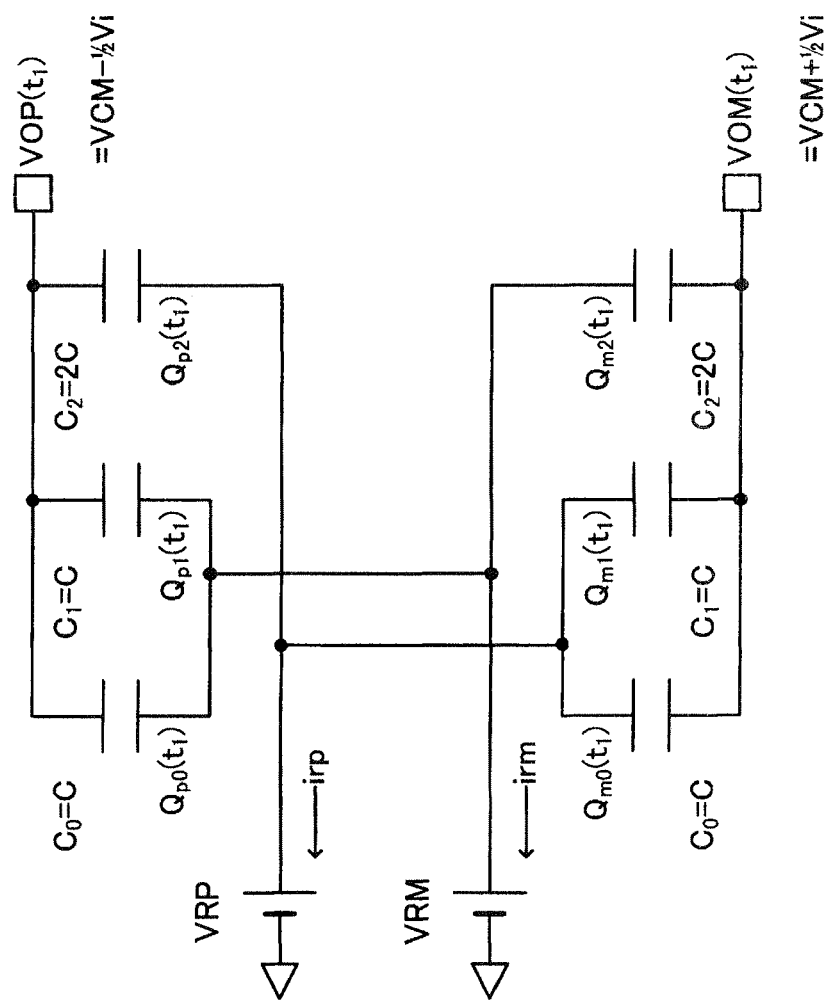
FIG. 9 is a diagram illustrating the connection state of the capacitor group of the differential DAC and the charge state of each capacitor, during the period of comparison operation Comp1.

FIG. 9 is a diagram illustrating the connection state of the capacitor group of the differential DAC and the charge state of each capacitor, during the period of comparison operation Comp1. As shown in FIG. 7 and FIG. 9, in the comparison operation Comp1 for the first bit during the time $t_0$–$t_1$, the plus-side control digital signals $\phi_s$, $\phi_{r0}$, $\phi_{r1}$, $\phi_{r1b}$, $\phi_{r2}$, $\phi_{r2b}$ become 0, 1, 1, 0, 1, 0, and the corresponding switches become ON or OFF. Thus, as shown in FIG. 9, the second electrodes of the plus-side capacitors $C_0$, $C_1$ are connected to the minus-side reference voltage VRM, and the second electrode of the capacitor $C_2$ is connected the plus-side reference voltage VRP. Namely, VRM is connected to the capacitance value 2C of $C_0+C_1$, and VRP is connected to the capacitance value 2C of $C_2$, respectively.

Oppositely, the minus-side control digital signals $\phi_s$, $\phi_{r0}$, $\phi_{r1}$, $\phi_{r1b}$, $\phi_{r2}$, $\phi_{r2b}$ also become 0, 1, 1, 0, 1, 0, and the corresponding switches become ON or OFF. Thus, as shown in FIG. 9, the second electrodes of the minus-side capacitors $C_0$, $C_1$ are connected to the plus-side reference voltage VRP, and the second electrode of the capacitor $C_2$ is connected the minus-side reference voltage VRM. Namely, VRP is connected to the capacitance value 2C of $C_0+C_1$, and VRM is connected to the capacitance value 2C of $C_2$, respectively.

As a result, at the time $t_1$ when the comparison operation for the first bit is completed, charges $Q_{p0}(t_1)$, $Q_{p1}(t_1)$ and $Q_{p2}(t_1)$ stored in the respective plus-side capacitors are as follows.

$$Q_{p2}(t_1)=2C(VRP-VOP(t_1)) \quad (17)$$

$$Q_{p1}(t_1)=C(VRM-VOP(t_1)) \quad (18)$$

$$Q_{p0}(t_1)=C(VRM-VOP(t_1)) \quad (19)$$

Similarly, at the time $t_1$ when the comparison operation for the first bit is completed, charges $Q_{m0}(t_1)$, $Q_{m1}(t_1)$ and $Q_{m2}(t_1)$ stored in the respective minus-side capacitors $C_0$, $C_1$, $C_2$ are as follows.

$$Q_{m2}(t_1)=2C(VRM-VOM(t_1)) \quad (20)$$

$$Q_{m1}(t_1)=C(VRP-VOM(t_1)) \quad (21)$$

$$Q_{m0}(t_1)=C(VRP-VOM(t_1)) \quad (22)$$

Then, on the plus-side analog output $VOP(t_1)$ at the time the comparison operation Comp1 is completed, from the law of conservation of charge that the charge amount at the output terminal VOP in the floating state is conserved, a total charge amount of expressions (11), (12), (13)=a total charge amount of expressions (17), (18), (19), namely, $$Q_{p2}(t_0)+Q_{p1}(t_0)+Q_{p0}(t_0)=Q_{p2}(t_1)+Q_{p1}(t_1)+Q_{p0}(t_1)$$

holds. By solving this, $$VOP(t_1)=VCM-Vi/2 \quad (23)$$

is obtained. Similarly, on the minus-side analog output $VOM(t_1)$, a total charge amount of expressions (14), (15), (16)=a total charge amount of expressions (20), (21), (22), namely, $$Q_{m2}(t_0)+Q_{m1}(t_0)+Q_{m0}(t_0)=Q_{m2}(t_1)+Q_{m1}(t_1)+Q_{m0}(t_1)$$

holds. By solving this, $$VOM(t_1)=VCM+Vi/2 \quad (24)$$

is obtained.

The above expressions (23), (24) are identical to expressions (1), (2) having been explained in FIG. 4. Then, the comparison result Cout in the comparator CMP at the time $t_1$ is input to the control circuit CONT, and the inverted signal thereof is memorized as a first bit. As described earlier, the first bit is the sign bit.

As shown in FIG. 9, in the comparison operation Comp1, a current irp caused by charge transfer is produced at the plus-side reference voltage terminal VRP, and also a current irm caused by charge transfer is produced at the minus-side reference voltage terminal VRM. The above currents irp, irm bring about an increased consumption current, and produce ringing noise on the connection line to an external power supply.

Now, in the following, power which is consumed by charge/discharge caused by the above current irp, irm between the time $t_0$ when the sampling is completed and the time $t_1$ when the comparison operation is completed is obtained. Namely, in the following expressions, consumed power $P_{vrp1}$, $P_{vrm1}$ at each reference voltage VRP, VRM is a product of each reference voltage VRP, VRM by each charge/discharge current irp, irm. Because the charge/discharge currents irp, irm vary during the time $t_0$–$t_1$, the above product is integrated between the time $t_0$ and $t_1$. Further, each current irp, irm can be replaced by a variation dQ/dt of the charge per unit time. Further, an integrated value of dQ/dt during the time $t_0$–$t_1$ is equal to a value obtained by subtracting the charge amount at the time $t_0$ from the charge amount at the time $t_1$.

$$P_{vrp1} = VRP \cdot \int_{t_0}^{t_1} irp \cdot dt \qquad (25)$$

$$= VRP \cdot \int_{t_0}^{t_1} \frac{dQ}{dt} \cdot dt$$

$$= VRP \cdot \begin{bmatrix} (Q_{p2}(t_1) + Q_{m1}(t_1) + Q_{m0}(t_1)) - \\ (Q_{p2}(t_0) + Q_{m1}(t_0) + Q_{m0}(t_0)) \end{bmatrix}$$

$$= C \cdot V_r \cdot (V_r + 2VCM)$$

$$P_{vrm1} = VRM \cdot \int_{t_0}^{t_1} irm \cdot dt$$

$$= VRM \cdot \int_{t_0}^{t_1} \frac{dQ}{dt} \cdot dt$$

$$= VRM \cdot \begin{bmatrix} (Q_{m2}(t_1) + Q_{p1}(t_1) + Q_{p0}(t_1)) - \\ (Q_{m2}(t_0) + Q_{p1}(t_0) + Q_{p0}(t_0)) \end{bmatrix}$$

$$= C \cdot V_r \cdot (V_r - 2VCM)$$

$$P_{total1} = P_{vrp1} + P_{vrm1}$$

$$= 2C \cdot V_r^2$$

The above expression (25) indicates the total charge/discharge power.

[Comparison Operation Comp2]

Next, comparison operation for the second bit is performed.

In the comparison operation for the second bit, by means of the control digital signals generated according to the result of the comparison Comp1 for the first bit, the second electrode of the capacitor $C_n$ at the uppermost level and the capacitor one level lower than the capacitor $C_n$, are connected to either the reference voltage VRP or VRM. Connections of the second electrodes of the capacitors $C_0$–$C_{n-2}$ at the further lower levels are not changed. As a result, the analog output voltages VOP, VOM are changed to $$VOP=VCM-Vi/2+Vr/4 \qquad (3)$$

$$VOM=VCM+Vi/2-Vr/4 \qquad (4)$$

or $$VOP=VCM-Vi/2-Vr/4 \qquad (26)$$

$$VOM=VCM+Vi/2+Vr/4 \qquad (27)$$

The above expressions (3), (4) are identical to FIG. 4.

FIG. 10 is a diagram illustrating the connection state of the capacitor group of the differential DAC and the charge state of each capacitor, during the period of the comparison operation Comp2. In FIG. 7, in the comparison operation Comp2, $\phi_{r1}$, $\phi_{r2}$ are in a reversed-phase relationship, and also $\phi_{r1b}$, $\phi_{r2b}$ are in a reversed-phase relationship. Needless to say, $\phi_{r1}$, $\phi_{r1b}$ are in a reversed-phase relationship, and $\phi_{r2}$, $\phi_{r2b}$ are in a reversed-phase relationship, also.

In the 2-bit CDAC shown in FIG. 6, the capacitor at the uppermost level is $C_2$, and the capacitor one level lower than the above is $C_1$. In the plus-side CDACp, the capacitor $C_1$ is connected to VRP, and the capacitor $C_2$ is connected to either VRP or VRM according to the result of the comparison operation Comp1.

In the comparison operation Comp1, in case of VOP($t_1$) <VOM($t_1$), in both the plus side and the minus side, by setting $$\phi_{r0},\phi_{r1},\phi_{r1b},\phi_{r2},\phi_{r2b}=1,0,1,1,0,$$

the plus-side capacitors $C_2$, $C_1$ are connected to VRP and the minus-side capacitors $C_2$, $C_1$ are connected to VRM. As a result, the charge amount of each capacitor becomes as shown in FIG. 10.

Then, from the law of conservation of charge at analog output terminals VOP, VOM, since the total charge amount is equal between at the time $t_1$ and the time $t_{2a}$, $$Q_{p2}(t_1)+Q_{p1}(t_1)+Q_{p0}(t_1)=Q_{p2}(t_{2a})+Q_{p1}(t_{2a})+Q_{p0}(t_{2a})$$

holds. By solving this, $$VOP(t_{2a})=VCM-Vi/2+Vr/4 \qquad (28A)$$

$$VOM(t_{2a})=VCM+Vi/2-Vr/4 \qquad (29A)$$

are obtained. These expressions are identical to the (3), (4) described earlier.

On the other hand, in case of VOP($t_1$)>=VOM($t_1$), in both the plus side and the minus side, by setting $$\phi_{r0},\phi_{r1},\phi_{r1b},\phi_{r2},\phi_{r2b}=1,0,1,0,1,$$

the plus-side capacitor $C_2$ is connected to VRM, and the $C_1$ is connected to VRP, and also, the minus-side capacitor $C_2$ is connected to VRP, and the $C_1$ is connected to VRM. As a result, the charge amount of each capacitor becomes as shown in FIG. 10.

Then, from the law of conservation of charge at analog output terminals VOP, VOM, since the total charge amount is equal between at the time $t_1$ and the time $t_{2b}$, $$Q_{p2}(t_1)+Q_{p1}(t_1)+Q_{p0}(t_1)=Q_{p2}(t_{2b})+Q_{p1}(t_{2b})+Q_{p0}(t_{2b})$$

holds. By solving this, $$VOP(t_{2b})=VCM-Vi/2-Vr/4 \qquad (28B)$$

$$VOM(t_{2b})=VCM+Vi/2+Vr/4 \qquad (29B)$$

are obtained. Only the difference is that the signs of Vr/4 are reversed from the above (28A), (29A).

Namely, the switches $\phi_{r1}$, $\phi_{r1b}$ for the capacitor $C_1$ are reversed from the time $t_1$ to $t_2$. Also, the switches $\phi_{r2}$, $\phi_{r2b}$ for the capacitor $C_2$ are either left unchanged at VRP or switched to VRM from the time $t_1$ to $t_2$, according to the result of the comparison Comp1.

In the example shown in FIG. 6, a comparison Comp3 for the third bit does not exist. However, in the example shown in FIG. 5, at the comparison operation for the third bit, with regard to a capacitor pair $C_{n-2}$, $C_{n-3}$ at the next lower level, a switchover to the reference voltages VRP, VRM is performed in a similar manner to the above. On the other hand, the connection relationship of other capacitors to the reference voltages is maintained.

Now, in the case of VOP($t_1$)<VOM($t_1$), similar to the aforementioned case, charge/discharge power in the second bit comparison Comp2 from the time $t_1$ to $t_2$ becomes as follows.

$$P_{vrp2a} = VRP \cdot \left\{ \begin{array}{l} Q_{p2}(t_{2a}) + Q_{p1}(t_{2a}) + Q_{m0}(t_{2a}) - \\ (Q_{p2}(t_1) + Q_{p1}(t_1) + Q_{m0}(t_1)) \end{array} \right\} \qquad (30)$$

$$P_{vrm2a} = VRM \cdot \left\{ \begin{array}{l} Q_{m2}(t_{2a}) + Q_{m1}(t_{2a}) + Q_{p0}(t_{2a}) - \\ (Q_{m2}(t_1) + Q_{m1}(t_1) + Q_{p0}(t_1)) \end{array} \right\}$$

$$P_{total2a} = P_{vrp2a} + P_{vrm2a}$$

$$= \frac{1}{2}CV_r^2$$

Similarly, in the case of VOP($t_1$)>=VOM($t_1$), the charge/discharge power becomes as follows.

$$P_{vrp2b} = VRP \cdot \left\{ \begin{array}{l} Q_{m2}(t_{2b}) + Q_{p1}(t_{2b}) + Q_{m0}(t_{2b}) - \\ (Q_{m2}(t_1) + Q_{p1}(t_1) + Q_{m0}(t_1)) \end{array} \right\} \quad (31)$$

$$P_{vrm2b} = VRM \cdot \left\{ \begin{array}{l} Q_{p2}(t_{2b}) + Q_{m1}(t_{2b}) + Q_{p0}(t_{2b}) - \\ (Q_{p2}(t_1) + Q_{m1}(t_1) + Q_{p0}(t_1)) \end{array} \right\}$$

$$P_{total2b} = P_{vrp2b} + P_{vrm2b}$$

$$= \frac{5}{2} CV_r^2$$

As can be understood by the comparison of expression (30) with (31), in the case of VOP($t_1$)>=VOM($t_1$), the charge/discharge power becomes greater by the amount of charge/discharge current at the capacitor $C_2$. As such, the connection states of the reference voltages VRP, VRM are switched relative to the pair of capacitors $C_2$, $C_1$, and accordingly, the charge/discharge power caused thereby becomes greater.

Differential Successive Approximation Register ADC in First Embodiment

According to the successive approximation register ADC in the present embodiment, by making the second electrode of the capacitor group not connected to the reference voltages VRP, VRM in the comparison operation Comp1 for the first bit, it is possible to make zero charge/discharge power at that time, and also to reduce the charge/discharge power in the comparison operation for the second bit and after, in comparison to the aforementioned comparison example. Further, it is possible to reduce the capacitance value of the capacitor having a maximally weighted capacitance value to ½ of the comparison example.

Figure 11:
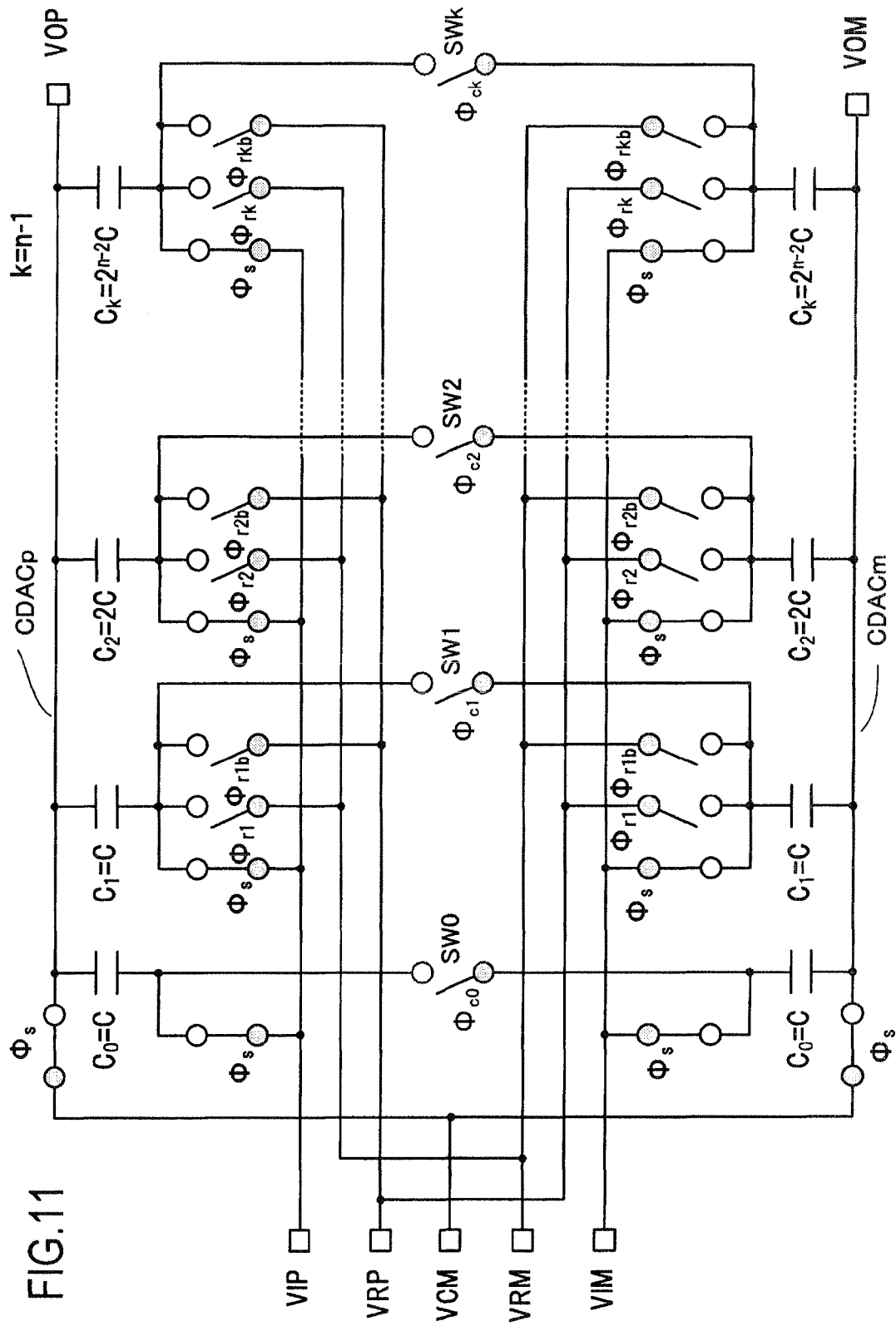
FIG. 11 is a configuration diagram of the differential DAC provided in the differential successive approximation register ADC according to the first embodiment.

FIG. 11 is a configuration diagram of the differential DAC provided in the differential successive approximation register ADC according to the first embodiment. The above differential DAC is an all-differential n-bit CDAC having a plus-side CDACp and a minus-side CDACm.

Similar to the comparison example shown in FIG. 5, the plus-side CDACp includes (N-1) capacitors $C_1$-$C_k$ (k=n-1) on the plus side, having capacitance values C, 2C, 4C ... $2^{n-2}$C weighted by the powers of 2; a plus-side analog output terminal VOP connected to each first electrode of the plus-side capacitors $C_1$-$C_k$; and a plurality of plus-side switches $\phi_s$, $\phi_{r0}$, $\phi_{r1}$, $\phi_{r1b}$-$\phi_{rkb}$ for connecting each second electrode of the plus-side capacitors $C_1$-$C_k$ to either one of a plus-side analog input terminal VIP, a plus-side reference voltage terminal VRP and a minus-side reference voltage terminal VRM. The above plus-side switches are controlled to be conductive (ON) or non-conductive (OFF) according to the plus-side control digital signals $\phi_s$, $\phi_{r1}$, $\phi_{r1b}$-$\phi_{rk}$ and $\phi_{rkb}$. Further, the plus-side CDACp includes a switch $\phi_s$ which is set ON at the time of sampling. For the sake of simplicity, the citation symbol of each switch is made identical to the citation symbol of each control digital signal for controlling the switch. Further, the connection relationship of the switch pair $\phi_{rm}$, $\phi_{rmb}$ (1≦m≦k), for connecting the capacitors $C_1$-$C_k$ to the reference voltages VRP, VRM, to the reference voltages VRP, VRM is entirely identical.

The plus-side CDACp further includes a plus-side auxiliary capacitor $C_0$ having a minimum capacitance value C. With the provision of the above auxiliary capacitor $C_0$, a conversion error is eliminated. Therefore, if the error to this degree is tolerable, it is not necessary to provide the above auxiliary capacitor $C_0$.

The minus-side CDACm has a similar configuration to the plus-side CDACp, and includes N-1 capacitors $C_1$-$C_k$ on the minus side having capacitance values weighted by the powers of 2; a minus-side analog output terminal VOM connected to each first electrode of the minus-side capacitors $C_1$-$C_n$; and a plurality of switches $\phi_s$, $\phi_{r1}$, $\phi_{r1b}$-$\phi_{rk}$ and $\phi_{rkb}$ for connecting each second electrode of the minus-side capacitors to either one of a minus-side analog input terminal VIM, the plus-side reference voltage terminal VRP and the minus-side reference voltage terminal VRM according to minus-side control digital signals $\phi_s$, $\phi_{r1}$, $\phi_{r1b}$-$\phi_{rk}$ and $\phi_{rkb}$. Further, the minus-side CDACm includes a minus-side auxiliary capacitor $C_0$ and a switch $\phi_s$ which is set ON at the time of sampling. It is also possible to omit the above auxiliary capacitor $C_0$ when the error is tolerable.

Further, according to the present embodiment, a plurality of short-circuit switches $SW_0$-$SW_k$ are provided between the second electrodes of at least identically weighted plus-side capacitors and minus-side capacitors. The above short-circuit switches are controlled ON/OFF by means of control digital signals $\phi_{c0}$-$\phi_{ck}$ generated by the control circuit CONT.

The differential successive approximation register ADC according to the present embodiment has the same overall configuration as the configuration shown in FIG. 2, and includes the all-differential CDAC shown in FIG. 11, as CDACp and CDACm.

As such, in the case of n-bit CDAC in the present embodiment, the plus-side CDACp and the minus-side CDACm respectively have n capacitors, with the addition of auxiliary capacitors $C_0$. Namely, as compared with the comparison example shown in FIG. 5, according to the present embodiment, each capacitor $C_n = 2^{n-1}C$ on the most significant bit, which is provided in the comparison example shown in FIG. 5 and has the largest capacitance value, becomes unnecessary in the plus-side CDACp and the minus-side CDACm. The CDACp area in the integrated circuit becomes reduced by that amount. Namely, according to the present embodiment, the size of the only capacitor group becomes half as large as the size thereof in the comparison example.

In the all-differential CDAC according to the present embodiment, at the time of sampling, the plus-side and minus-side switches $\phi_s$ connect each second electrode of the above plus-side and minus-side capacitors to the plus-side input terminal VIP and the minus-side input terminal VIM, respectively, so that charges are stored in the capacitor groups according to the differential analog input voltages VIP, VIM. At this time, the entire short-circuit switches are OFF.

Further, at the time of comparison operation for the first bit after the sampling, the plurality of short-circuit switches $SW_0$-$SW_k$ respectively short-circuit between the second electrodes of at least identically weighted plus-side capacitors and minus-side capacitors. By the above short-circuit operation, the following voltages are produced at the analog output terminals VOP, VOM.

$$VOP = VCM - Vi/2 \quad (1)$$

$$VOM = VCM + Vi/2 \quad (2)$$

Moreover, by the above short-circuit operation in the comparison operation for the first bit, because the capacitor group is not connected to the reference voltage terminals VRP, VRM, charge/discharge current to the reference voltage terminals is not produced and therefore, the charge/discharge power is zero.

Further, in the comparison operation for the second bit and after, from the most significant bit to the lower bits, the second electrode of only a single capacitor is connected to either the reference voltages VRP, VRM according to the comparison result. Namely, in the comparison operation for the second bit and after, only charge/discharge current to the single capacitor is produced, and the charge/discharge power thereof becomes smaller than the comparison example. Furthermore, because the capacitor $C_n=2^{n-1}C$ having the maximum capacitance value in the comparison example is not existent, the charge/discharge power thereto is restrained. As such, because the charge/discharge current to the reference voltage terminals is restrained, ringing caused thereby is restrained, and malfunction can be avoided.

Hereafter, the operation of the differential CDAC according to the present embodiment will be described, taking a case of 2 bits as an example.

Figure 12:
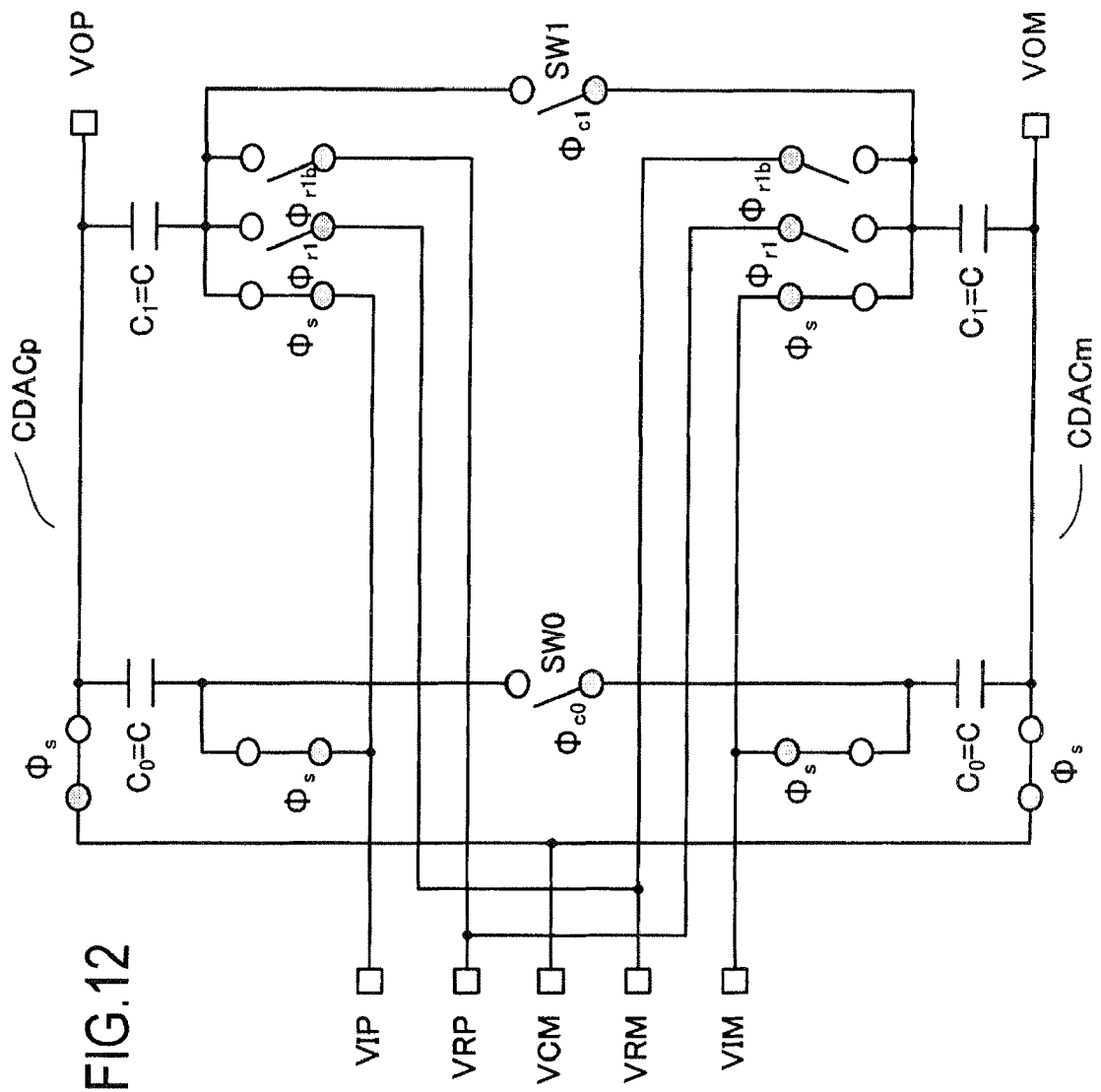
FIG. 12 is a configuration diagram of the 2-bit differential CDAC provided in the differential successive approximation register ADC according to the first embodiment.

FIG. 12 is a configuration diagram of the 2-bit differential CDAC provided in the differential successive approximation register ADC according to the first embodiment. In this example, in the n-bit differential CDAC shown in FIG. 11, there are provided an auxiliary capacitor $C_0$ and one capacitor $C_1$, switches $\phi_s$, $\phi_{r1}$, $\phi_{r1b}$ therefor, and short-circuit switches $SW_0$, $SW_1$. It is understood that the largest capacitor $C_2$, which is provided in the comparison example shown in FIG. 6, is not provided.

Figure 13:
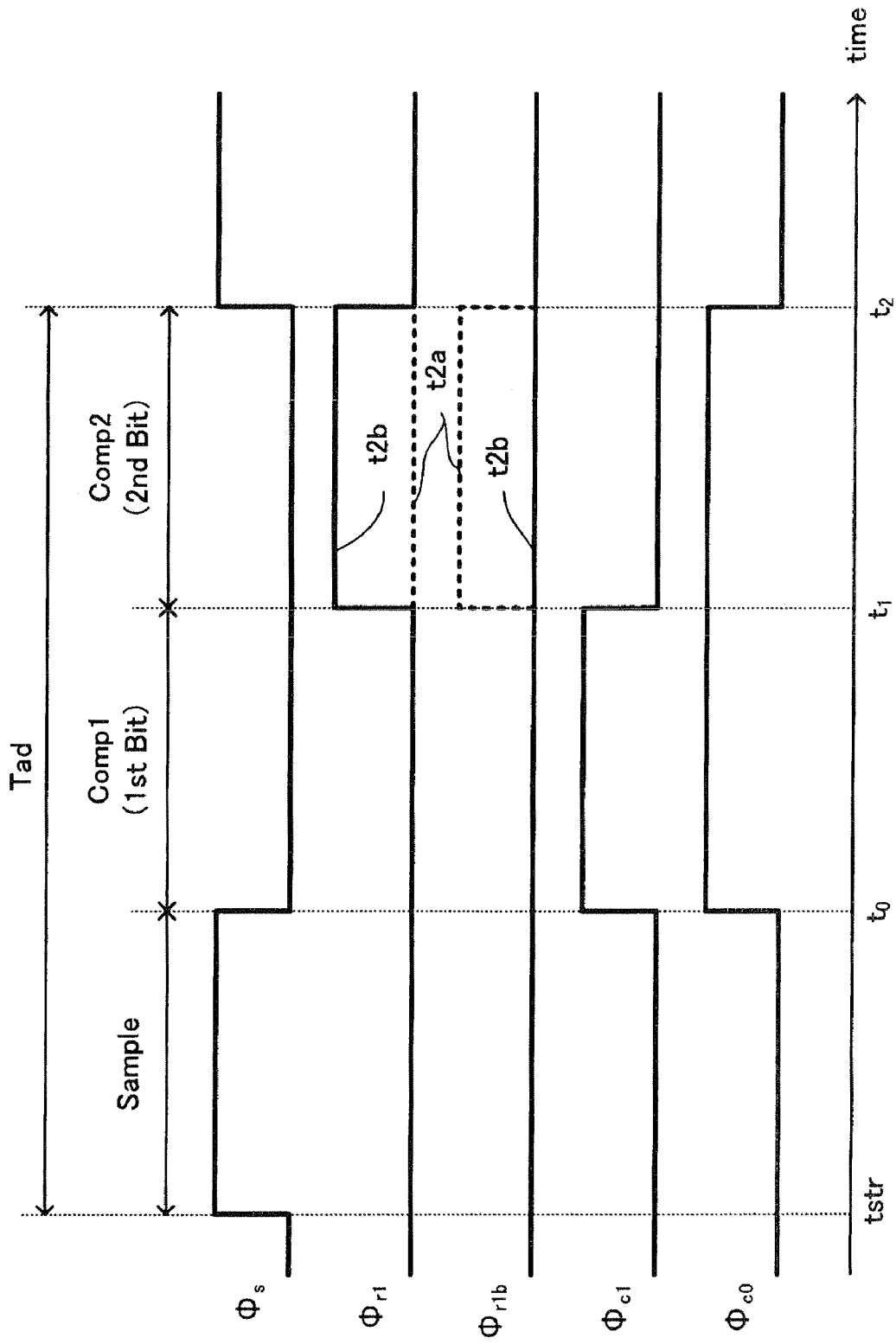
FIG. 13 is a diagram illustrating the operation of FIG. 12.

Further, FIG. 13 is a diagram illustrating the operation of FIG. 12.

[Sampling Period]

As shown in FIG. 13, during the sampling period between the time $t_{str}$ to $t_0$, the control digital signals $\phi_s$, $\phi_{r1}$, $\phi_{r1b}$, $\phi_{c1}$, $\phi_{c0}$ on both the minus side and the plus side become $$\phi_s,\phi_{r1},\phi_{r1b},\phi_{c1},\phi_{c0}=1,0,0,0,0$$

and thus, as shown in FIG. 12, only the switches $\phi_s$ become ON, and the other switches become OFF. As a result, both the plus-side analog output terminal VOP and the minus-side analog output terminal VON, which are common nodes connected to the first electrodes of the capacitor group, are connected to the common-phase voltage terminal VCM (VOP, VOM=VCM). Also, to the second electrodes of the capacitor group, the plus-side analog input terminal VIP and the minus-side analog input terminal VIM are connected, respectively.

Figure 14:
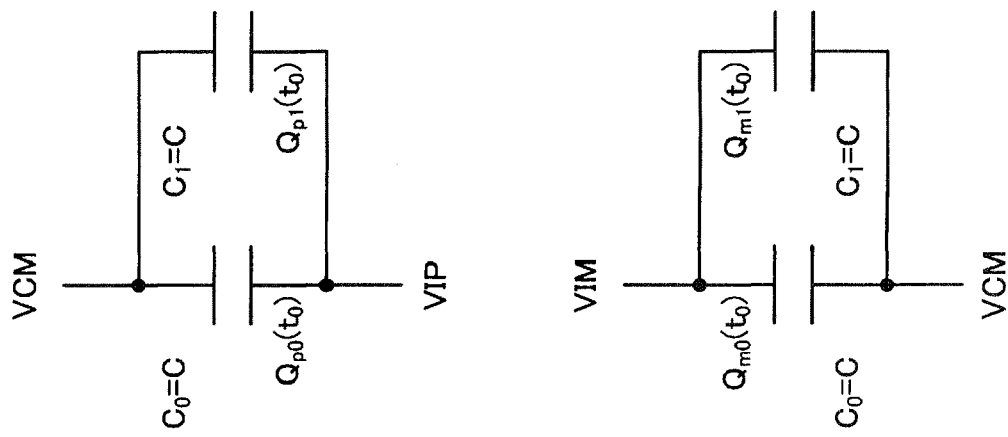
FIG. 14 is a diagram illustrating the connection state of the capacitor group in the differential DAC and the charge state of each capacitor, during the sampling period.

FIG. 14 is a diagram illustrating the connection state of the capacitor group in the differential DAC and the charge state of each capacitor, during the sampling period. As shown in FIG. 14, VIP−VON is applied to the plus-side capacitors $C_0$, $C_1$, $C_2$, and at the time $t_0$ when the sampling period is completed, charges $Q_{p0}(t_0)$, $Q_{p1}(t_0)$ stored in the respective plus-side capacitors are as follows.

$$Q_{p1}(t_0)=C(VIP-VCM) \quad (32)$$

$$Q_{p0}(t_0)=C(VIP-VCM) \quad (33)$$

Similarly, VIM−VCM is applied to the minus-side capacitors $C_0$, $C_1$, and at the time $t_0$ when the sampling period is completed, charges $Q_{m0}(t_0)$, $Q_{m1}(t_0)$ stored in the respective minus-side capacitors are as follows.

$$Q_{m1}(t_0)=C(VIM-VCM) \quad (34)$$

$$Q_{m0}(t_0)=C(VIM-VON) \quad (35)$$

Next, in the comparison operation Comp1, Comp2 thereafter, the control digital signal $\phi_s=0$, and the switch $\phi_s$ becomes OFF. Thus, both the analog output terminals VOP, VOM become floating states (high impedance states), and the charge at the first electrodes of the capacitor group is conserved. On the other hand, in the comparison operation Comp1, the control digital signals $\phi_{c1}$, $\phi_{c0}=1$, and both the short-circuit switches $SW_0$, $SW_1$ become ON. Thus, short-circuits are formed between the second electrodes of the capacitors $C_0$ and between the second electrodes of the capacitors $C_1$, respectively.

Further, in the exemplary case shown in FIG. 11, in the comparison operation Comp2 and after, the short-circuit switch $SW_k$ of the uppermost level capacitor $C_k$ is set OFF. Then, according to the previous comparison result, the second electrode of the above uppermost level capacitor $C_k$ is connected to one of the reference voltages VRP, VRM, and then the produced analog outputs VOP, VOM are compared. Further, in the next comparison operation, the short-circuit switch $SW_{k-1}$ of the capacitor $C_{k-1}$, which is one level lower, is set OFF. Then, according to the previous comparison result, the second electrode thereof is connected to one of the reference voltages VRP, VRM. The comparison operation is repeated until the lowest level capacitor $C_1$.

In the example shown in FIG. 12, because there are only two bits, the short-circuit switch $SW_1$ of the capacitor $C_1$ becomes OFF in the comparison operation Comp2, and according to the result of the comparison operation Comp1, the second electrode of the capacitor $C_1$ is connected to either one of the reference voltages VRP, VRM, and then the produced analog outputs VOP, VOM are compared.

[Comparison Operation Comp1]

Figure 15:
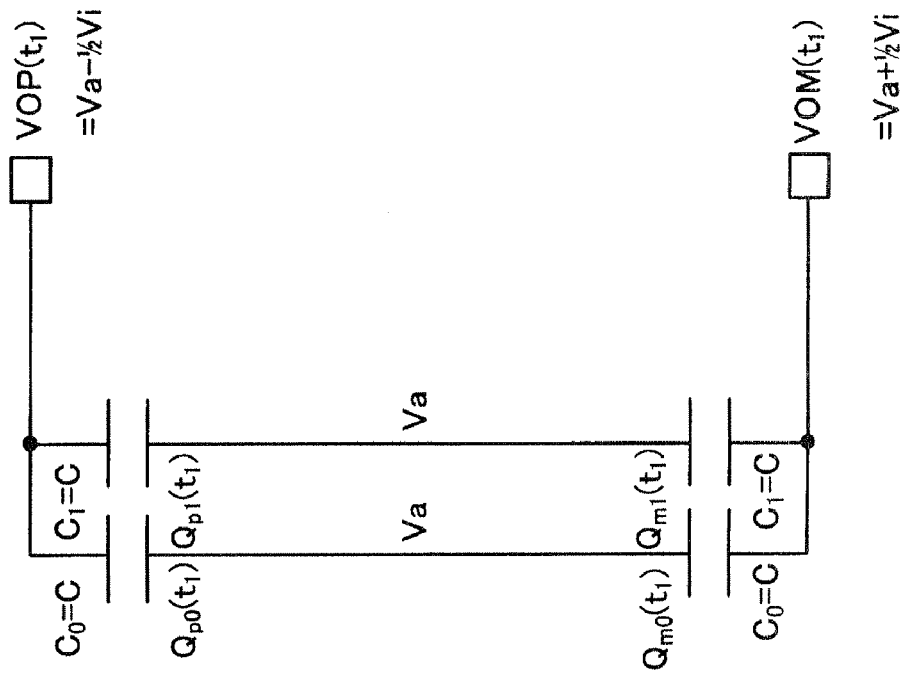
FIG. 15 is a diagram illustrating the connection state of the capacitor group in the differential DAC and the charge state of each capacitor, during the period of comparison operation Comp1.

FIG. 15 is a diagram illustrating the connection state of the capacitor group in the differential DAC and the charge state of each capacitor, during the period of comparison operation Comp1. As shown in FIG. 13 and FIG. 15, in the comparison operation Comp1 for the first bit during the time $t_0$–$t_1$, the plus-side and minus-side control digital signals $\phi_s$, $\phi_{r1}$, $\phi_{r1b}$, $\phi_{c1}$, $\phi_{c0}$ become $$\phi_s,\phi_{r1},\phi_{r1b},\phi_{c1},\phi_{c0}=0,0,0,1,1$$

and the corresponding switches become ON or OFF. Thus, as shown in FIG. 15, the second electrodes of the plus-side capacitors $C_0$, $C_1$ and the second electrodes of the minus-side capacitors $C_0$, $C_1$ are short-circuited via the short-circuit switches $SW_0$, $SW_1$, respectively.

As a result, at the time $t_1$ when the comparison operation Comp1 for the first bit is completed, charges $Q_{p0}(t_1)$, $Q_{p1}(t_1)$ stored in the respective plus-side capacitors $C_0$, $C_1$ are as follows.

$$Q_{p1}(t_1)=C(Va-VOP(t_1)) \quad (36)$$

$$Q_{p0}(t_1)=C(Va-VOP) \quad (37)$$

Similarly, charges $Q_{m0}(t_1)$, $Q_{m1}(t_1)$ stored in the minus-side capacitors $C_0$, $C_1$ are as follows.

$$Q_{m1}(t_1)=C(Va-VOM(t_1)) \quad (38)$$

$$Q_{m0}(t_1)=C(Va-VOM(t_1)) \quad (39)$$

Here, Va is the voltage of the short-circuited second electrode. Because the capacitance values of the plus-side and minus-side capacitors are equal, theoretically, (VIP−VIM)/2=VCM holds. Namely, although the analog inputs VIP, VIM have been applied to the second electrodes during the sampling period, because the short circuit is formed between the second electrodes in the comparison period Comp1, it is considered that charge transfer occurs between the short-circuited plus-side capacitor and the minus-side capacitor.

Then, in regard to the plus-side analog output VOP($t_1$) at the time when the comparison operation Comp1 is completed, from the law of conservation of charge at the output terminal VOP in a floating state, total charge in expressions (32), (33)=total charge in expressions (36), (37), namely, $$\phi_{p1}(t_0)+Q_{p0}(t_0)=Q_{p1}(t_1)+Q_{p0}(t_1)$$

holds. By solving this, $$VOP(t_1)=Va-Vi/2 \qquad (40)$$

is obtained. Similarly, in regard to the minus-side analog output $VON(t_1)$,
total charge in expressions (34), (35)=total charge in expressions (38), (39), namely, $$Q_{m1}(t_0)+Q_{m0}(t_0)=Q_{m1}(t_1)+Q_{m0}(t_1)$$

holds. By solving this, $$VOM(t_i)=Va+Vi/2 \qquad (41)$$

is obtained.

Because Va=VCM is satisfied theoretically, the above expressions (40), (41) are identical to expressions (1), (2) described in FIG. 4. Then, the comparison result Cout in the comparator CMP at the time $t_1$ is input to the control circuit CONT, and the inverted signal thereof is memorized as a first bit. As described earlier, the first bit is the sign bit.

The above expressions (40), (41) may also be derived by the following idea. In the sampling state shown in FIG. 14, a voltage VIP−VCM=Vi/2 is applied between the electrodes of the plus-side capacitors $C_0$, $C_1$, while a voltage VIM−VCM=−Vi/2 is applied between the electrodes of the minus-side capacitors $C_0$, $C_1$. From this state, when the short-circuit switches $SW_0$, $SW_1$ are ON in the comparison operation for the first bit shown in FIG. 15, the second electrodes of the plus-side and minus-side capacitors $C_0$, $C_1$ are connected, so as to have an identical voltage Va. Accordingly, in the plus-side capacitors $C_0$, $C_1$, the plus-side analog output voltage VOP, at the first electrode becomes a voltage obtained by subtracting a voltage VIP−VCM=Vi/2, which has been applied to the capacitor, from the voltage Va of the second electrode, namely, $$VOP=Va-(VIP-VCM)=Va-Vi/2$$

is obtained. Similarly, in the minus-side capacitors $C_0$, $C_1$, $$VOM=Va-(VIM-VCM)=Va+Vi/2$$

is obtained. The above expressions are identical to the aforementioned expressions (40), (41).

In the above comparison operation for the first bit, only the capacitors on the plus side and the minus side are short-circuited, and no charge/discharge current is produced between with the reference voltages and other voltage sources. Therefore, power consumption by charge/discharge current is zero.

[Comparison Operation Comp2]

Next, comparison operation Comp2 for the second bit is performed.

In the comparison operation Comp2 for the second bit, the short-circuit switch $SW_k=SW_{n-1}$ of the uppermost level capacitor $C_k=C_{n-1}$ is OFF. By means of the control digital signals produced according to the result of the comparison operation Comp1 for the first bit, the second electrode of the above uppermost level capacitor $C_k=C_{n-1}$ is connected to either the reference voltage VRP or VRM. The short-circuit switches of and the second electrodes of the capacitors $C_0-C_{n-2}$ lower than the above levels are not changed. In other words, the second electrode of a single capacitor corresponding to the comparison bit is connected to either one of the reference voltages VRP, VRM, and charge/discharge current is produced accordingly.

As a result, the analog output voltages VOP, VOM $$VOP=(Va+VCM)/2-Vi/2+Vr/4 \qquad (42A)$$

$$VOM=(Va+VCM)/2+Vi/2-Vr/4 \qquad (43A)$$

or $$VOP=(Va+VCM)/2-Vi/2-Vr/4 \qquad (42B)$$

$$VOM=(Va+VCM)/2+Vi/2+Vr/4 \qquad (43B)$$

are produced. Because of Va=VCM, (Va+VCM)/2=VCM holds. Then, the above expressions (42A) to (43B) are identical to expressions (28A) to (29B) in the comparison example.

Figure 16A:
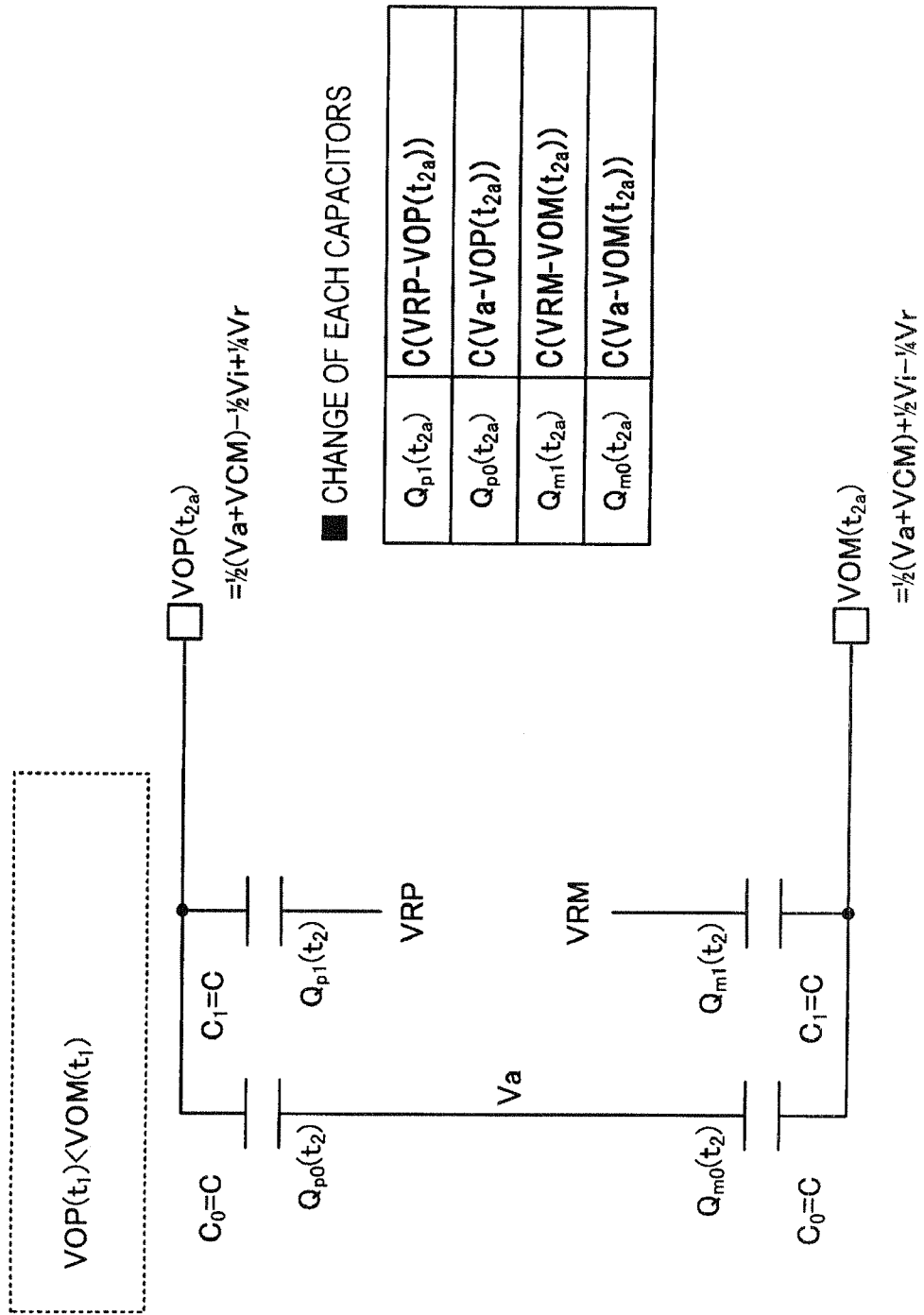
FIG. 16 is a diagram illustrating the connection state of the capacitor group and the charge state of each capacitor in the differential DAC, during the period of the comparison operation Comp2.

FIG. 16 is a diagram illustrating the connection state of the capacitor group and the charge state of each capacitor in the differential DAC, during the period of the comparison operation Comp2. In FIG. 13, in the comparison operation Comp2, $\phi_{ck}=0$ is set, and according to the comparison result, $\phi_{rk}$, $\phi_{rkb}=1, 0$ or $0, 1$ is obtained.

In the 2-bit CDAC shown in FIG. 12, the capacitor at the uppermost level is $C_1$. In the plus-side CDACp, the above capacitor $C_1$ is connected to either VRP or VRM according to the result of the comparison operation Comp1.

In the comparison operation Comp1, in case of $VOP(t_1)$ <$VOM(t_1)$, in both the plus side and the minus side, by setting $$\phi_s,\phi_{r1},\phi_{r1b},\phi_{c1},\phi_{c0}=0,0,1,0,1$$

the plus-side capacitors $C_1$ is connected to VRP and the minus-side capacitor $C_1$ is connected to VRM. As a result, the charge amount of each capacitor becomes as shown in FIG. 16.

Then, from the law of conservation of charge at the analog output terminals VOP, VOM, since the total charge amount is equal between at the time $t_1$ and the time $t_{2a}$, $$Q_{p1}(t_1)+Q_{p0}(t_1)=Q_{p1}(t_{2a})+Q_{p0}(t_{2a})$$

holds. By solving this, $$VOP(t_{2a}) = Va/2 + VRP/2 - Vi/2 \qquad (44A)$$
$$= (Va + VCM)/2 - Vi/2 + Vr/4$$

is obtained. Similarly, by solving $$Q_{m1}(t_1)+Q_{m0}(t_1)=Q_{m1}(t_{2a})+Q_{m0}(t_{2a}), VOM(t_{2a})=(Va+VCM)/2+Vi/2-Vr/4 \qquad (45A)$$

is obtained.

On the other hand, in case of $VOP(t_1)$>=$VOM(t_1)$, in both the plus side and the minus side, by setting $$\phi_s,\phi_{r1},\phi_{r1b},\phi_{c1},\phi_{c0}=0,1,0,0,1$$

the plus-side capacitor $C_1$ is connected to VRM, and the minus-side capacitor $C_1$ is connected to VRP. As a result, the charge amount of each capacitor becomes as shown in FIG. 16.

Then, from the law of conservation of charge at the analog output terminals VOP, VOM, since the total charge amount is equal between at the time $t_1$ and the time $t_{2b}$, $$Q_{p1}(t_1)+Q_{p0}(t_1)=Q_{p1}(t_{2b})+Q_{p0}(t_{2b})$$

holds. By solving this, $$VOP(t_{2b}) = Va/2 + VRM/2 - Vi/2 \quad (44B)$$
$$= (Va + VCM)/2 - Vi/2 + Vr/4$$

is obtained. Similarly, by solving $$Q_{m1}(t_1)+Q_{m0}(t_1)=Q_{m1}(t_{2a})+Q_{m0}(t_{2a}), VOM(t_{2b})=(Va+VCM)/2+Vi/2+Vr/4 \quad (45B)$$

is obtained.

Because of Va=VCM, (Va+VCM)/2=VCM holds. The above expressions (44A) to (45B) are identical to expressions (28A) to (29B) in the comparison example.

Namely, the short-circuit switch $SW_1$ for the capacitor $C_1$ becomes OFF, and further, the switches $\phi_{r1}$, $\phi_{r1b}$ are switched to VRP or VRM, according to the result of the comparison Comp1. Then, charge/discharge current is produced from the reference voltages VRP, VRM only to the capacitor C.

Then, the comparator CMP compares the analog output VOP with VOM, and the comparison output Cout is input to the control circuit CONT. By inverting the comparison result Cout, the control circuit CONT stores as a second bit.

Now, in the case of $VOP(t_1) < VOM(t_1)$, similar to the aforementioned case, charge/discharge power in the comparison Comp2 for the second bit from the time $t_1$ to $t_2$ becomes as follows.

$$P_{vrp2a} = VRP \cdot \{Q_{p1}(t_{2a}) - Q_{p1}(t_1)\} \quad (46)$$
$$P_{vrm2a} = VRM \cdot \{Q_{m1}(t_{2a}) - Q_{m1}(t_1)\}$$
$$P_{total2a} = P_{vrp2a} + P_{vrm2a}$$
$$= \frac{1}{4}CV_r^2$$

Similarly, in the case of $VOP(t_1) \geq VOM(t_1)$, only the connection targets of the reference voltages VRP, VRM are different, and similar to the case of $VOP(t_1) < VOM(t_1)$, the following is obtained.

$$P_{total2b} = \frac{1}{4}CV_r^2 \quad (47)$$

Namely, irrespective of the comparison result of the first bit, charge/discharge power in the comparison operation Comp2 for the second bit becomes identical. Moreover, because the charge/discharge current is produced only at the single capacitor $C_1$, the charge/discharge power is smaller than the power shown by expressions (30), (31) of the comparison example. Further, because the capacitance value of the capacitor $C_1$ having the maximum capacity is smaller (½) than the capacitor $C_2$ having the maximum capacity in the comparison example, the charge/discharge power is smaller by that amount.

To describe the comparison operation for the third bit and thereafter, the following description is given by taking a 3-bit CDAC as an example.

Figure 17:
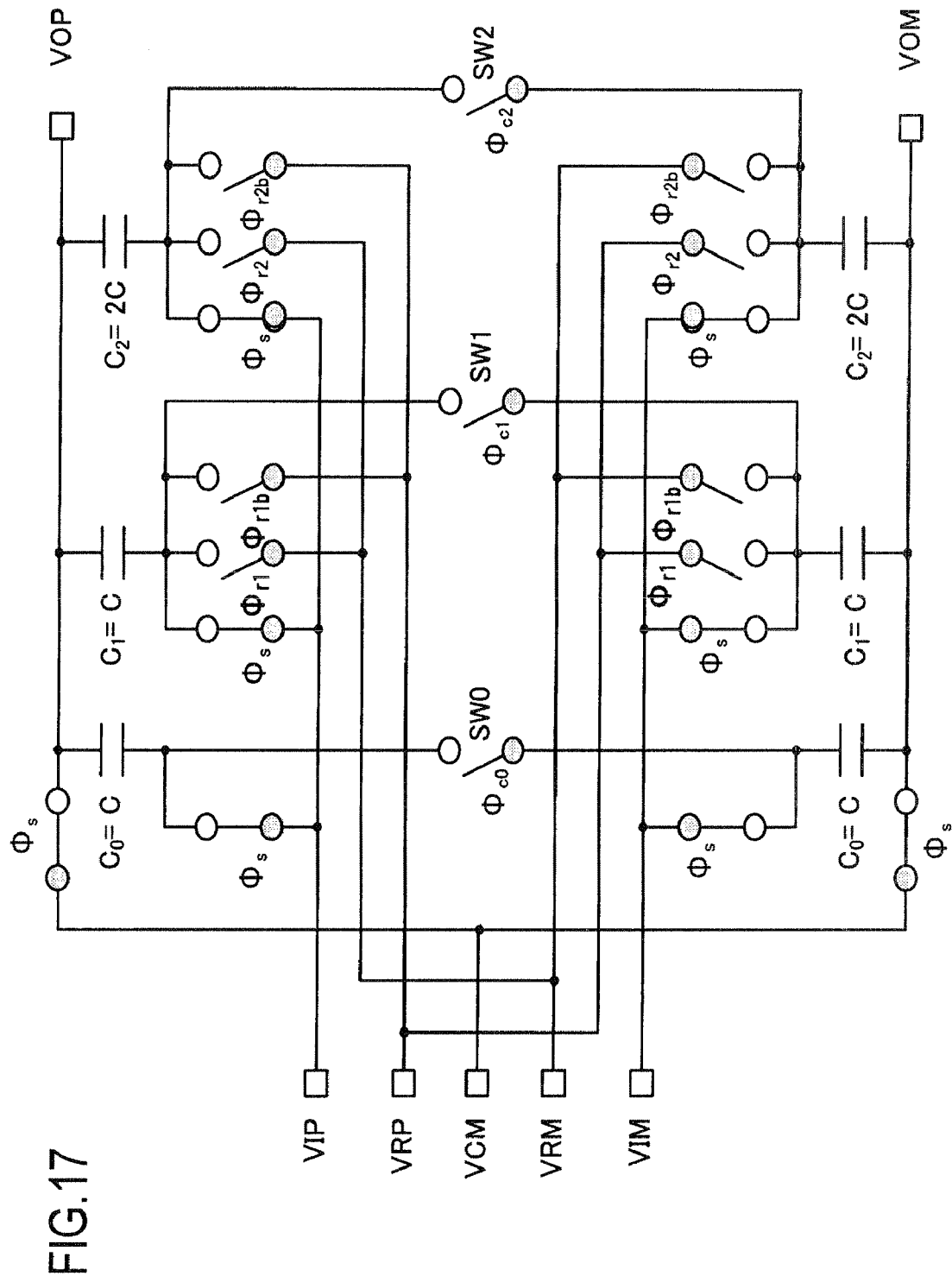
FIG. 17 is a configuration diagram of the 3-bit differential DAC provided in the differential successive approximation register ADC according to the first embodiment.

FIG. 17 is a configuration diagram of the 3-bit differential DAC provided in the differential successive approximation register ADC according to the first embodiment. In this example, in the n-bit differential CDAC shown in FIG. 11, an auxiliary capacitor $C_0$ and two capacitors $C_1$, $C_2$ are provided, and switches $\phi_s$, $\phi_{r1}$, $\phi_{r1b}$, $\phi_{r2}$, $\phi_{r2b}$ and short-circuit switches $SW_0$, $SW_1$, $SW_2$ therefor are provided also.

Figure 18:
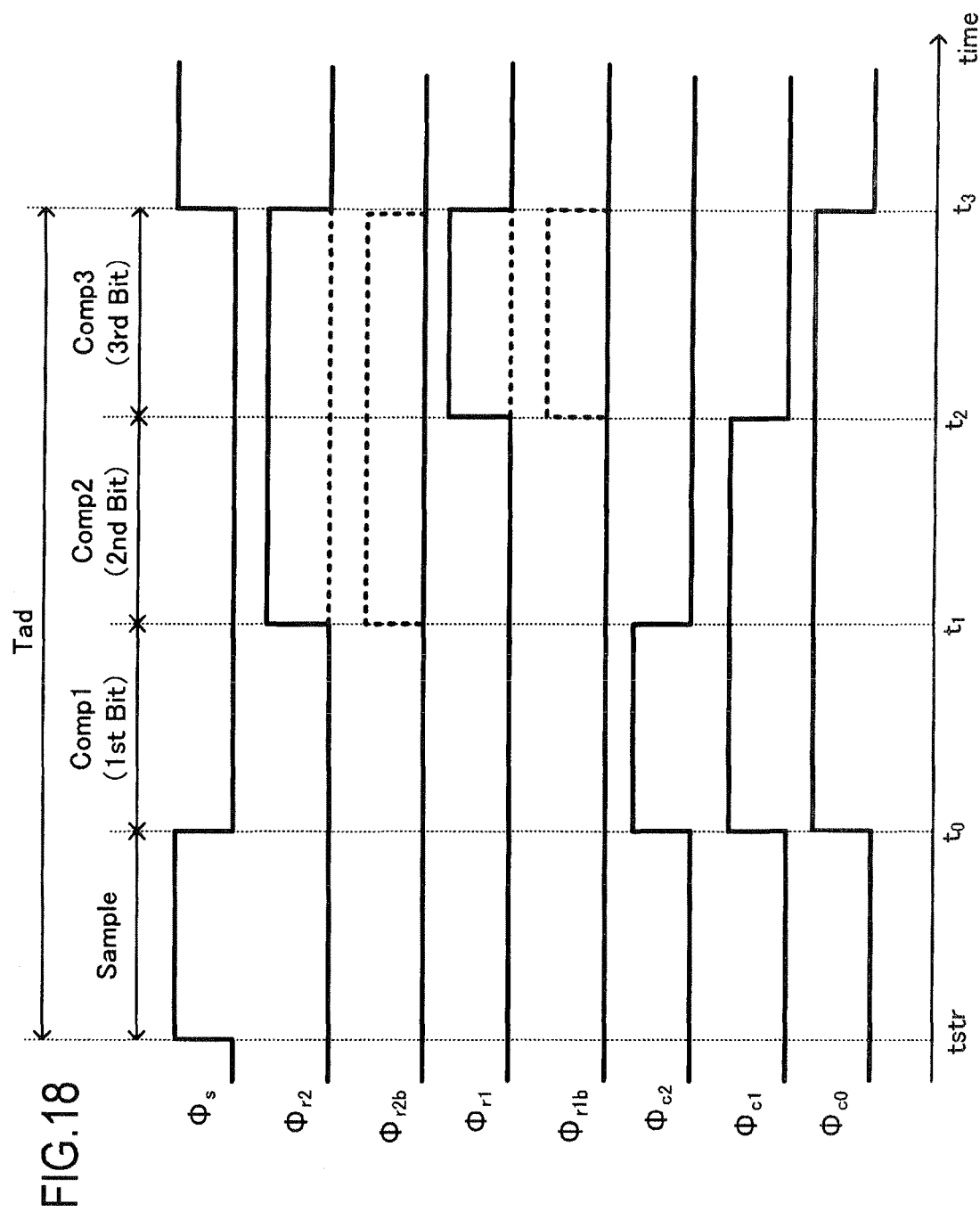
FIG. 18 is a diagram illustrating the operation of FIG. 17.

Further, FIG. 18 is a diagram illustrating the operation of FIG. 17.

During the sampling period Sample, only the sampling switches $\phi_s$ are ON, and the other switches are entirely OFF. As a result, VIP−VCM is applied to the entire capacitors on the plus side, and VIM−VCM is applied to the entire capacitors on the minus side. The above operation is identical to the case of two-bit configuration.

Next, in the comparison operation Comp1 for the first bit, the sampling switches p, are set OFF, and the entire short-circuit switches $SW_0$–$SW_2$ are set ON. As a result, $$VOP=Va-Vi/2, VOM=Va+Vi/2$$

are obtained. The above operation is also identical to the case of two-bit configuration.

In the comparison operation Comp2 for the second bit, the short-circuit switch $SW_2$ ($\phi_{c2}$) for the capacitor $C_2$ at the uppermost bit is set OFF, and according to the comparison result of the first bit, the switches $\phi_{r2}$, $\phi_{r2b}$ of the above capacitor $C_2$ are set ON, OFF or OFF, ON, so that the capacitor $C_2$ is connected to VRP or VRM. At this time, the short-circuit switches $SW_1$, $SW_2$ of the lower level capacitors $C_1$, $C_0$ are left ON. As a result, the aforementioned expressions (44A) to (45B) hold.

In the comparison operation Comp2 for the second bit, the second electrode of the capacitor $C_2$=2C of the uppermost bit is switched from Va=VCM at the time $t_1$ to VRP or VRM at the time $t_2$. Namely, the second electrode is increased or decreased by +Vr/2 or −Vr/2. At this time, because the capacitance value 2C of the capacitor $C_2$ is equal to the total capacitance value 2C of the lower level capacitors $C_1$, $C_0$, when the voltage of the second electrode of the capacitor $C_2$ is increased or decreased by +Vr/2 or −Vr/2, it may be understood from the law of distribution of charge that, a voltage change of +Vr/4 or −Vr/4, which corresponds to ½ of the voltage change +Vr/2 or −Vr/2 at the second electrode of the capacitor $C_2$, is produced in the analog output voltages VOP, VOM.

Then, finally, in the comparison operation Comp3 for the third bit, the short-circuit switch $SW_1$($\phi_{c1}$) of the capacitor $C_1$ at the next lower level becomes OFF, and according to the comparison result of the comparison operation Comp2, the switches $\phi_{r1}$, $\phi_{r1b}$ of the above capacitor $C_1$ become OFF, ON or ON, OFF. The states of the other switches are maintained. Namely, only in the capacitor $C_1$, the short-circuit state is released, and the capacitor $C_1$ is connected to one of the reference voltages VRP, VRM, according to the comparison result of the comparison operation Comp2.

The second electrode of the capacitor $C_1$=C is switched from Va=VCM at the time $t_2$ to VRP or VRM at the time $t_3$. Namely, at the second electrode, an increase or a decrease, +Vr/2 or −Vr/2, is produced. At this time, because the capacitance value C of the capacitor $C_1$ is ¼ of the total capacitance values of the entire capacitors $C_2$, $C_1$ and $C_0$, when the voltage of the second electrode of the capacitor $C_1$ is increased or decreased to +Vr/2 or −Vr/2, it may be understood from the law of distribution of charge that a voltage change of +Vr/8 or −Vr/8, which corresponds to ¼ of the voltage change +Vr/2 or −Vr/2 at the second electrode of the capacitor $C_1$, is produced in the analog output voltages VOP, VOM.

Namely, $$VOP(t_{3aa})=(Va+VCM)/2-Vi/2+Vr/4+Vr/8 \quad (46\text{AA})$$

$$VOM(t_{3aa})=(Va+VCM)/2+Vi/2-Vr/4-Vr/8 \quad (47\text{AA}),$$

$$VOP(t_{3ab})=(Va+VCM)/2-Vi/2+Vr/4-Vr/8 \quad (46\text{AB})$$

$$VOM(t_{3ab})=(Va+VCM)/2+Vi/2-Vr/4+Vr/8 \quad (47\text{AB}),$$

$$VOP(t_{3ba})=(Va+VCM)/2-Vi/2-Vr/4+Vr/8 \quad (46\text{BA})$$

$$VOM(t_{3ba})=(Va+VCM)/2+Vi/2+Vr/4-Vr/8 \quad (47\text{BA})$$

or $$VOP(t_{3bb})=(Va+VCM)/2-Vi/2-Vr/4-Vr/8 \quad (46\text{BB})$$

$$VOM(t_{3bb})=(Va+VCM)/2+Vi/2+Vr/4+Vr/8 \quad (47\text{BB})$$

are obtained.

As described above, in the comparison operation for the third bit, by permutations and combinations of the comparison results of the first bit and the second bit, four types of states are produced. In all cases, the analog output voltages VOP, VOM are increased or decreased by +Vr/8 or −Vr/8.

From the above-mentioned example of the 3-bit CDAC, the comparison operation for an n-bit CDAC is self-explanatory. That is, in comparison operation for the m-th ($2 \leq m \leq n$) bit, the short-circuit switch of a capacitor corresponding to the m-th bit is set OFF, and according to a comparison result of the (m−1)th bit, the second electrode of the capacitor corresponding to the m-th bit is connected to VRP or VRM. In regard to other switches, ON or OFF states are maintained.

Differential Successive Approximation Register ADC in Second Embodiment

Figure 19:
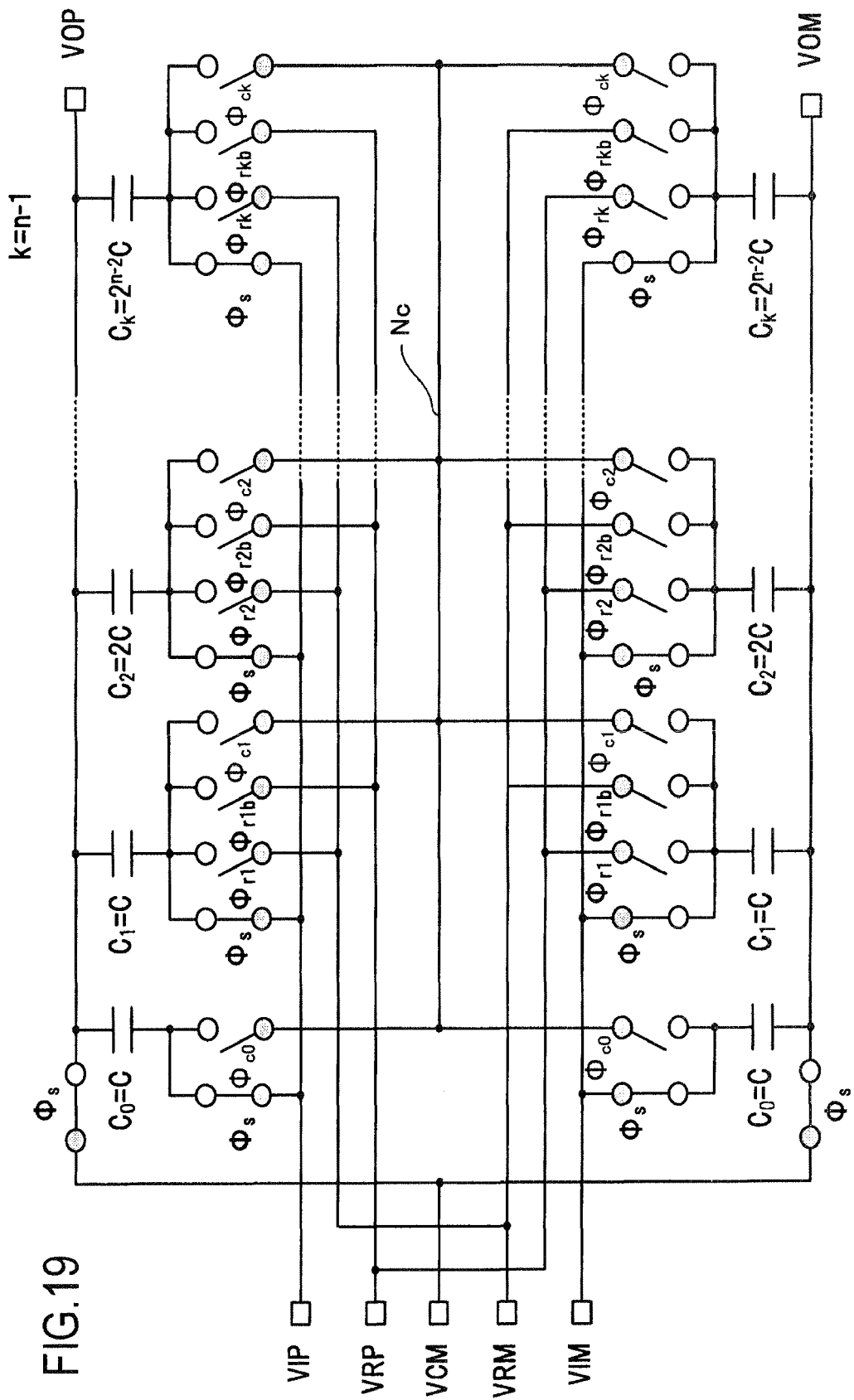
FIG. 19 is a circuit diagram of a differential DAC provided in the differential successive approximation register ADC, according to a second embodiment.

FIG. 19 is a circuit diagram of a differential DAC provided in the differential successive approximation register ADC, according to a second embodiment. This differential CDAC has a different configuration of short-circuit switches from the configuration shown in FIG. 11. Namely, short-circuit switches $\phi_{c0}$–$\phi_{ck}$ are provided on respective capacitors $C_0$–$C_k$ disposed on the plus side and the minus side, and the second electrodes of the above capacitors $C_0$–$C_k$ are connected to a common node Nc. Namely, in FIG. 11, the second electrodes of the entire plus-side and minus-side capacitors having the same capacitance are short-circuited. However, according to the second embodiment shown in FIG. 19, the second electrodes of the entire plus-side and minus-side capacitors are short-circuited via the common node Nc and the short-circuit switches $\phi_{c0}$–$\phi_{ck}$.

According to the short-circuit switch configuration, the short-circuit voltage Va at the capacitors for the entire bits become identical, and accordingly, the common-phase voltage (VOP+VOM)/2 of an analog output VOP on the plus-side CDAC and an analog output VOM on the minus-side CDAC is stabilized in comparison with the example shown in FIG. 11. In the case of FIG. 11, because the short-circuited node (second electrode) of each bit is not mutually connected, the common-phase voltage between the analog outputs VOP, VON are affected by the dispersion of the capacitance values of each capacitor for each bit, operation-by-operation of the comparison for each bit. However, because the comparator CMP only compares the magnitude of both analog outputs VOP, VOM, no problem occurs in the comparison operation.

Figure 20:
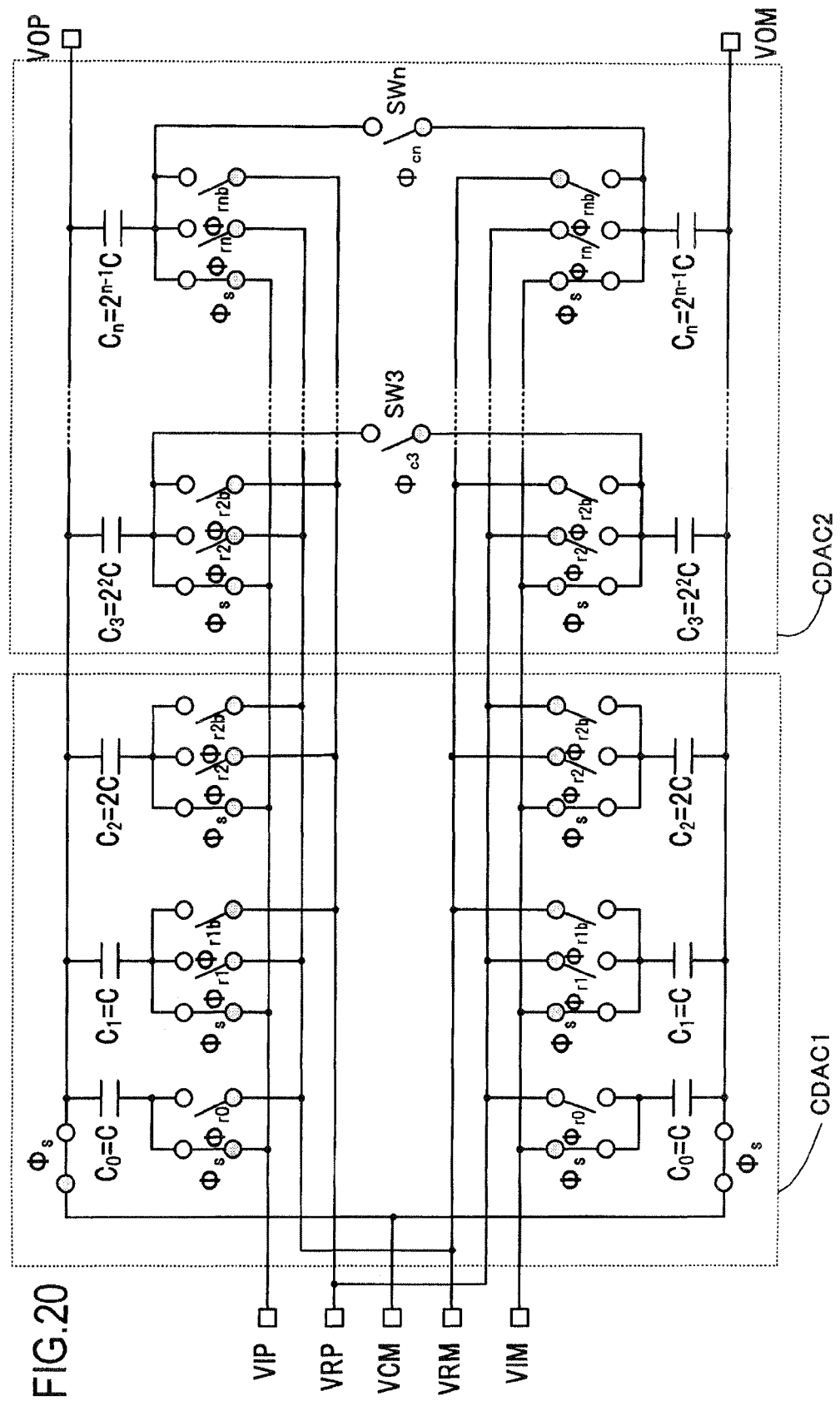
FIG. 20 is a circuit diagram of a differential DAC provided in the differential successive approximation register ADC, according to a third embodiment.

Differential Successive Approximation Register ADC According to Third Embodiment FIG. 20 is a circuit diagram of a differential DAC provided in the differential successive approximation register ADC, according to a third embodiment. This n-bit differential CDAC includes a CDAC1 for lower two bits and a CDAC2 for upper 3rd to n-th bits. The lower-level CDAC1 is the CDAC of the comparison example shown in FIGS. 5, 6, while the upper-level CDAC2 is the CDAC shown in FIG. 11. Therefore, in the upper-level CDAC, short-circuit switches $SW_3$–$SW_n$ are provided between the capacitors for each bit.

The operation of the above differential CDAC is that, at the time of sampling, a sampling switch $\phi_s$ is ON and other switches are OFF. Further, in the comparison operation for the first bit, the entire sampling switches $\phi_s$ are set OFF, so that separation from the analog input terminals VIP, VIM is made. Also, in the upper-level CDAC2, the entire short-circuit switches $SW_3$–$SW_n$ are set ON, and in the lower-level CDAC1, the identical states to FIG. 9 are produced. As a result, voltages produced at analog output terminals VOP, VOM become VOP=Va−Vi/2, VOM=Va+Vi/2, respectively.

Further, in the comparison operation for the second bit to the (n−2)th bit, the operation described in FIGS. 13-16 and FIG. 18 is carried out in the upper-level CDAC2, so that detection is made successively from the uppermost bit. Then, in the comparison operation for the (n−1)th bit and n-th bit of the lower levels, the operation described in FIGS. 7-10 is carried out in the lower-level CDAC1, so that detection is made for the lowest two bits.

According to the third embodiment, since the capacitor of maximum capacity is $C_n=2^{n-1}C$, the number of capacitors and the configuration thereof are identical to the comparison example shown in FIG. 5. However, in the comparison operation for the first bit, the short-circuit switches for the upper bits having large capacitance values of the capacitors are set ON in the CDAC2. Therefore, charge/discharge power with the reference voltage is not produced. Also, in the comparison operation for the second bit to the (n−2)th bit, only charge/discharge current is produced in a single capacitor. Therefore, the power consumption is smaller than in the comparison example shown in FIG. 5.

As having been described, in the CDAC according to the present embodiment, charge/discharge from the reference voltage is not produced at the time of first comparison operation immediately after the completion of sampling. Therefore, it is possible to remarkably reduce power consumption. Also, in the comparison operation for the second time and after, the capacitors simultaneously switched to the reference voltages are only one capacitor on the plus side and on the minus side respectively, corresponding to the bit concerned. Therefore, it is possible to reduce power consumption as compared to the comparison example. Furthermore, because the capacitance of the capacitor having the maximum capacity is smaller than in the comparison example, it is possible to reduce the overall capacitor size.

Figure 21:
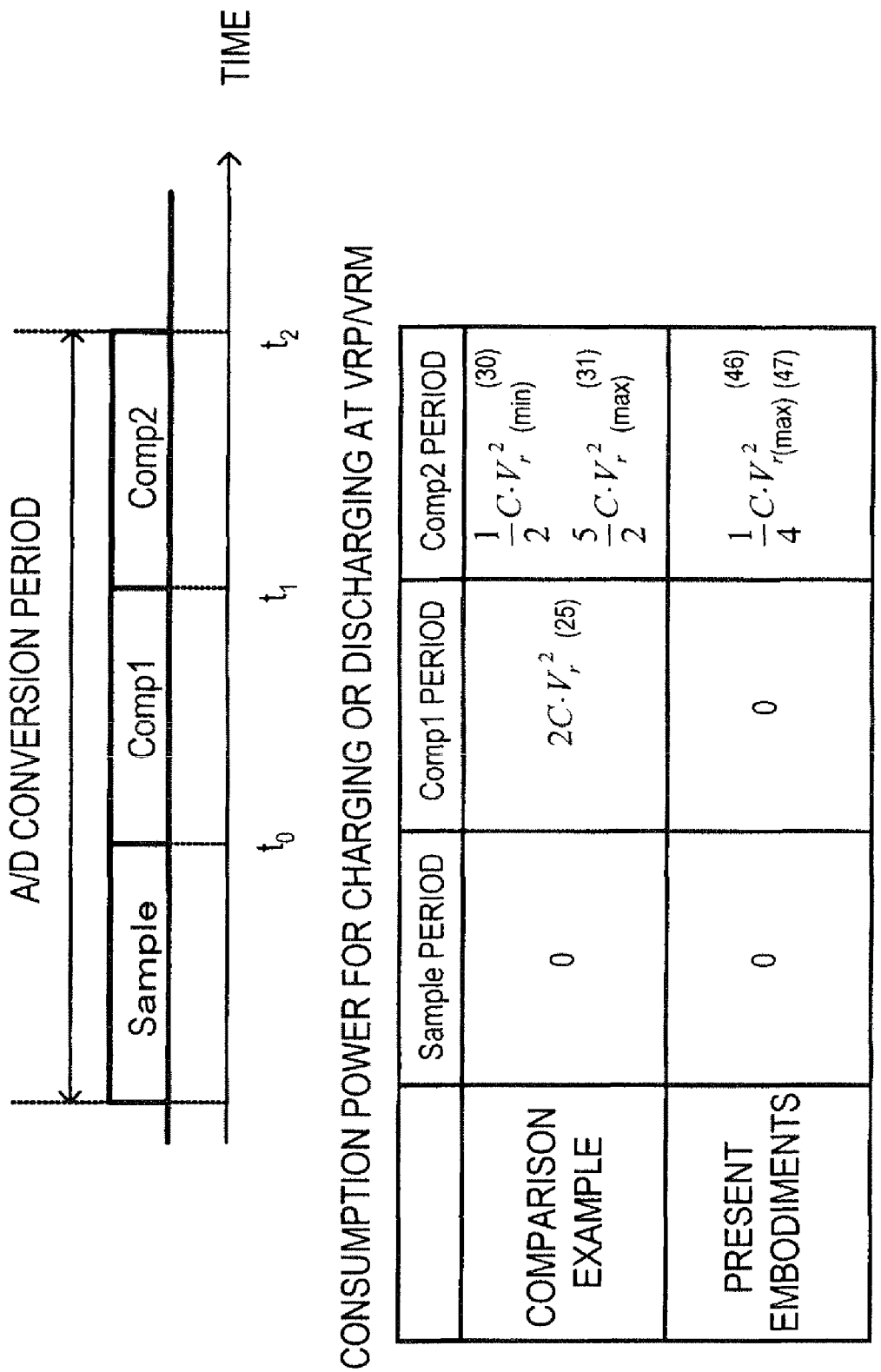
FIG. 21 is a diagram illustrating consumption power in the present embodiment and the comparison example.

FIG. 21 and FIG. 22 are diagrams illustrating consumption power in the present embodiment and the comparison example. In FIG. 21, consumption power obtained from expressions (25), (30), (31), (46) and (47) is shown. As is apparent from the above figure, according to the present embodiment, the consumption power can be greatly reduced as compared to the comparison example. In FIG. 22, the power in the comparison example (with dotted lines) and the power in the present embodiment (with solid lines) are shown respectively, for the case of VIP>VIM and the case of VIP<VIM of the differential analog inputs VIP, VIM on the horizontal axis. According thereto, in the case of 2-bit CDAC, power reduction as much as 1/18 at the maximum is achieved.

Further, in the differential CDAC according to the present embodiment, the total capacitance value of the capacitors becomes 1/2 of the comparison example. This signifies that the capacitor area can be reduced to half when the capacitors are formed in an LSI. In other words, in case of an identical capacitor configuration, a DAC having one bit more can be achieved.

According to the above-mentioned embodiment, a case that the all-differential n-bit CDAC is applied to SAR ADC has been shown. However, the all-differential n-bit CDAC is also applicable to other uses, as a circuit for generating an analog output according to control digital signals after sampling a certain analog input.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A digital-to-analog converter comprising:
   a plus-side input terminal and a minus-side input terminal for inputting differential analog signals;
   a plus-side reference voltage terminal and a minus-side reference voltage terminal;
   a plus-side digital-to-analog converter including a plurality of plus-side capacitors having capacitance values weighted by the powers of two, a plus-side output terminal connected to first electrodes of the plurality of plus-side capacitors, and a plurality of plus-side switches for connecting each second electrode of the plurality of plus-side capacitors to either the plus-side input terminal, the plus-side reference voltage terminal or the minus-side reference voltage terminal according to plus-side control digital signals;
   a minus-side digital-to-analog converter including a plurality of minus-side capacitors having capacitance values weighted by the powers of two, a minus-side output terminal connected to first electrodes of the plurality of minus-side capacitors, and a plurality of minus-side switches for connecting each second electrode of the plurality of minus-side capacitors to either the minus-side input terminal, the plus-side reference voltage terminal or the minus-side reference voltage terminal according to minus-side control digital signals; and
   a plurality of short-circuit switches provided between identically weighted plus-side capacitors and minus-side capacitors respectively,
   wherein, at the time of sampling, the plus-side and minus-side switches connect the second electrodes of the plus-side and minus-side capacitors to the plus-side and minus-side input terminals, respectively, and
   wherein, after the sampling, the plurality of short-circuit switches short-circuit between the second electrodes of the plus-side and minus-side capacitors.

2. The digital-to-analog converter according to claim 1, wherein the plurality of short-circuit switches short-circuit by connecting the second electrodes of the plurality of plus-side capacitors and the second electrodes of the plurality of minus-side capacitors to a common node.

3. The digital-to-analog converter according to claim 1, wherein the plus-side and minus-side digital-to-analog converters further include plus-side and minus-side auxiliary capacitors each having a minimum capacitance value among the capacitance values of the plurality of plus-side and minus-side capacitors respectively,
   wherein the first electrodes of the plus-side and minus-side auxiliary capacitors are connected to the plus-side and minus-side output terminals, respectively,
   wherein, at the time of the sampling, the plurality of plus-side and minus-side switches connect the second electrodes of the plus-side and minus-side auxiliary capacitors to the plus-side and minus-side input terminals, respectively, and
   wherein, after the sampling, the plurality of short-circuit switches also short-circuit between the second electrodes of the plus-side and minus-side auxiliary capacitors.

4. The digital-to-analog converter according to claim 1, wherein the plus-side and minus-side control digital signals are digital signals having N bits (N is an integer of 2 or more),
   wherein the plurality of short-circuit switches are provided only between the plus-side capacitors and the minus-side capacitors corresponding to a portion of bits on the upper side among the N bits, and
   wherein, after the sampling, the plurality of short-circuit switches short-circuit between the plus-side capacitors and the minus-side capacitors corresponding to the portion of the upper bits, and simultaneously, the plus-side and minus-side switches connect the second electrodes of the plus-side capacitors and the minus-side capacitors corresponding to the remaining bits on the lower side among the N bits to either the plus-side reference voltage terminal or the minus-side reference voltage terminal.

5. An analog-to-digital converter comprising:
   a digital-to-analog converter of any one of claims 1 to 4;
   a comparator for comparing voltages of the plus-side output terminal and the minus-side output terminal of the digital-to-analog converter; and
   a control circuit for generating the plus-side control digital signals and the minus-side control digital signals according to a comparison result of the comparator,
   wherein, at the time of a first comparison after the sampling, the plurality of short-circuit switches short-circuit between the second electrodes of the plus-side and minus-side capacitors, and
   wherein, at the time of a second comparison after the first comparison, the short-circuit switch makes open between the second electrodes of the plus-side and minus-side capacitors corresponding to the most significant bit among the plurality of plus-side and minus-side capacitors, and according to the comparison result of the comparator at the time of the first comparison, the plus-side and minus-side switches connect the second electrodes of the plus-side and minus-side capacitors corresponding to the most significant bit to either the plus-side reference voltage terminal or the minus-side reference voltage terminal.

6. The analog-to-digital converter according to claim 5, wherein, at the time of a K-th comparison (K is an integer of 3 or more) after the second comparison, the short-circuit switch makes open between the second electrodes of the plus-side and minus-side capacitors corresponding to a bit decided at the time of the K-th comparison, among the plurality of plus-side and minus-side capacitors, wherein, according to the comparison result of the comparator at the time of the (K-1)th comparison, the plus-side and minus-side switches connect the second electrodes of the plus-side and minus-side capacitors corresponding to the bit decided at the time of the K-th comparison to either the plus-side reference voltage terminal or the minus-side reference voltage terminal, and wherein the K-th comparison operation is repeated.

7. An analog-to-digital converter for converting a differential signal between plus-side and minus-side analog input signals to an N-bit (N is a plural number) digital output signal, comprising:

a plus-side input terminal and a minus-side input terminal for inputting differential analog signals;

a plus-side reference voltage terminal and a minus-side reference voltage terminal;

a plus-side digital-to-analog converter including a plurality of plus-side capacitors having capacitance values weighted by the powers of two, a plus-side output terminal connected to the first electrodes of the plurality of plus-side capacitors, and a plurality of plus-side switches for connecting the second electrodes of the plurality of plus-side capacitors to either the plus-side input terminal, the plus-side reference voltage terminal or the minus-side reference voltage terminal according to plus-side control digital signals;

a minus-side digital-to-analog converter including a plurality of minus-side capacitors having capacitance values weighted by the powers of two, a minus-side output terminal connected to each first electrode of the plurality of minus-side capacitors, and a plurality of minus-side switches for connecting each second electrode of the plurality of minus-side capacitors to either the minus-side input terminal, one of the plus-side reference voltage terminal and the minus-side reference voltage terminal according to minus-side control digital signals;

a plurality of short-circuit switches provided between identically weighted plus-side capacitors and minus-side capacitors;

a comparator for comparing voltages of the plus-side output terminal and the minus-side output terminal; and a control circuit for generating the plus-side control digital signals and the minus-side control digital signals according to the comparison result of the comparator, wherein, at the time of sampling, the plus-side and minus-side switches connect the second electrodes of the plus-side and minus-side capacitors to the plus-side and minus-side input terminals, respectively, and wherein, at the time of a first comparison after the sampling, the plurality of short-circuit switches short-circuit between the second electrodes of the plus-side and minus-side capacitors.

8. The analog-to-digital converter according to claim 7, wherein, at the time of a second comparison after the first comparison, the short-circuit switch makes open between the second electrodes of the plus-side and minus-side capacitors corresponding to the most significant bit among the plurality of plus-side and minus-side capacitors, and according to the comparison result of the comparator at the time of the first comparison, the plus-side and minus-side switches connect the second electrodes of the plus-side and minus-side capacitors corresponding to the most significant bit to either the plus-side reference voltage terminal or the minus-side reference voltage terminal.

9. The analog-to-digital converter according to claim 8, wherein, at the time of a K-th comparison (K is an integer of 3 or more) after the second comparison, the short-circuit switch makes open between the second electrodes of the plus-side and minus-side capacitors corresponding to a bit decided at the time of the K-th comparison, among the plurality of plus-side and minus-side capacitors, wherein, according to the comparison result of the comparator at the time of the (K-1)th comparison, the plus-side and minus-side switches connect the second electrodes of the plus-side and minus-side capacitors corresponding to a bit decided at the time of the K-th comparison to either the plus-side reference voltage terminal or the minus-side reference voltage terminal, and wherein the K-th comparison operation is repeated.

10. A digital-to-analog conversion method for a digital-to-analog converter having a plus-side input terminal and a minus-side input terminal for inputting differential analog signals, a plus-side reference voltage terminal and a minus-side reference voltage terminal, a plus-side digital-to-analog converter including a plurality of plus-side capacitors having capacitance values weighted by the powers of two, a plus-side output terminal connected to the first electrodes of the plurality of plus-side capacitors, and a plurality of plus-side switches for connecting the second electrodes of the plurality of plus-side capacitors to either the plus-side input terminal, the plus-side reference voltage terminal or the minus-side reference voltage terminal according to plus-side control digital signals, and a minus-side digital-to-analog converter including a plurality of minus-side capacitors having capacitance values weighted by the powers of two, a minus-side output terminal connected to the first electrodes of the plurality of minus-side capacitors, and a plurality of minus-side switches for connecting the second electrodes of the plurality of minus-side capacitors to either the minus-side input terminal and the plus-side reference voltage terminal or the minus-side reference voltage terminal according to minus-side control digital signals, the digital-to-analog conversion method comprising:

a sampling process in which, at the time of sampling, by means of the plus-side and minus-side switches, the second electrodes of the plus-side and minus-side capacitors are connected to the plus-side and minus-side input terminals, respectively; and after the sampling, a first comparison operation process in which the plus-side output terminal and the minus-side output terminal are set to floating states, and a short circuit is formed between the second electrodes of the plus-side and minus-side capacitors.

11. The digital-to-analog conversion method for the digital-to-analog converter according to claim 10, wherein, in the first comparison operation process, the second electrodes of the plus-side and minus-side capacitors are connected to a common node.

* * * * *